United States Patent
Berman

(10) Patent No.: US 10,650,889 B1
(45) Date of Patent: May 12, 2020

(54) ENERGY EFFICIENT PHASE CHANGE RANDOM ACCESS MEMORY CELL ARRAY WRITE VIA CONTROLLER-SIDE AGGREGATION MANAGEMENT

(71) Applicant: Samsung Electronics Co., Ltd., Suwon-si, Gyeonggi-do (KR)

(72) Inventor: Amit Berman, Ramat Gan (IL)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/220,328

(22) Filed: Dec. 14, 2018

(51) Int. Cl.
*G11C 13/00* (2006.01)

(52) U.S. Cl.
CPC ...... *G11C 13/0069* (2013.01); *G11C 13/0004* (2013.01); *G11C 13/004* (2013.01); *G11C 13/0026* (2013.01); *G11C 13/0028* (2013.01); *G11C 13/0097* (2013.01); *G11C 2013/0085* (2013.01)

(58) Field of Classification Search
CPC ............ G11C 13/0069; G11C 13/0097; G11C 2013/0085
USPC ....................................................... 365/163
See application file for complete search history.

(56) References Cited

U.S. PATENT DOCUMENTS

| 7,110,286 B2* | 9/2006 | Choi | G11C 13/0004 365/163 |
| 7,907,435 B2* | 3/2011 | Osada | G11C 13/0004 365/163 |
| 9,659,645 B2* | 5/2017 | Park | G11C 13/0069 |

* cited by examiner

*Primary Examiner* — Son L Mai
(74) *Attorney, Agent, or Firm* — Harness, Dickey & Pierce, P.L.C.

(57) ABSTRACT

A memory system includes a memory controller; and a memory device including a memory cell array, which includes a plurality of bit lines and a plurality of blocks. Each block includes a plurality of word lines, and each word line includes a plurality of phase-change random access memory (PRAM) cells connected, respectively, to the plurality of bit lines. The memory controller is configured to buffer write requests each including write data and is configured to perform a write operation that includes a reset phase and a subsequent set phase. The reset phase includes erasing the PRAM cells included in first word lines from among the plurality of word lines included in a selected block, from among the plurality of blocks, and the set phase includes, after the reset phase, writing the write data from the buffered write requests to the PRAM cells of the first word lines.

19 Claims, 10 Drawing Sheets

160

Validity Table

|        | Block 1 | Block 2 | Block 3 | Block 4 |
|--------|---------|---------|---------|---------|
| Page 1 | I | I | I | V |
| Page 2 | V | I | I | V |
| ⋮      | V | V | I | V |
| Page M | I | V | I | V |

FIG. 1C

ENERGY EFFICIENT PHASE CHANGE RANDOM ACCESS MEMORY CELL ARRAY WRITE VIA CONTROLLER-SIDE AGGREGATION MANAGEMENT

BACKGROUND

1. Field

The present disclosure relates to a technical field of data storage, and more particularly, relates to a method and device for operating a memory device in an energy efficient manner.

2. Related Art

Non-volatile memory products are used for many mobile, consumer and data-center applications. NAND flash is a very popular type of non-volatile memory. However, other memory technologies challenge traditional NAND Flash and present different power characteristics. For example, phase-change random access memory (PRAM) is a type of non-volatile memory device that employs a phase-change material as a storage element. The phase-change material may be considered a programmable resistive material that can be readily transformed between a high-resistance state and a low-resistance state. Such a state transformation of the phase-change material occurs, for example, in response to a change in the temperature thereof, and the temperature change may be induced through resistive heating. Resistive heating may be accomplished, for example, by supplying current between ends of the phase-change material.

SUMMARY

According to at least one example embodiments of the inventive concepts, a memory system includes a memory controller; and a memory device including a memory cell array, the memory cell array including a plurality of bit lines and a plurality of blocks, each block including a plurality of word lines, each word line including a plurality of phase-change random access memory (PRAM) cells connected, respectively, to the plurality of bit lines, the memory controller being configured to buffer a first number of write requests each of which includes write data and configured to perform a write operation that includes a reset phase and a subsequent set phase, the memory controller being further configured such that, the reset phase of the write operation includes erasing the PRAM cells included in first word lines from among the plurality of word lines included in a selected block, from among the plurality of blocks, and the set phase of the write operation includes, after the reset phase, writing the write data from the buffered first number of write requests to the PRAM cells of the first word lines.

According to at least one example embodiments of the inventive concepts, a memory system includes a memory controller; and a memory device including a memory cell array, the memory cell array including a plurality of bit lines and a plurality of blocks, each block including a plurality of word lines, each word line including a plurality of phase-change random access memory (PRAM) cells connected, respectively, to the plurality of bit lines, the memory controller being configured to buffer a first number of write requests each of which includes write data and configured to perform a write operation that includes a reset phase and a subsequent set phase, the memory controller being further configured such that, the reset phase includes controlling the memory device to selectively reset resistivity states of PRAM cells, from among the PRAM cells included in two or more first word lines of the selected block, to a high resistivity state in accordance with the write data included in the first number of write requests, and the set phase includes controlling the memory device to selectively set resistivity states of PRAM cells, from among the PRAM cells included in the two or more first word lines, to a low resistivity state in accordance with the write data included in the first number of write requests.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 1C illustrates a validity table 160 according to at least some example embodiments of the inventive concepts.

DETAILED DESCRIPTION

Figure 1A:
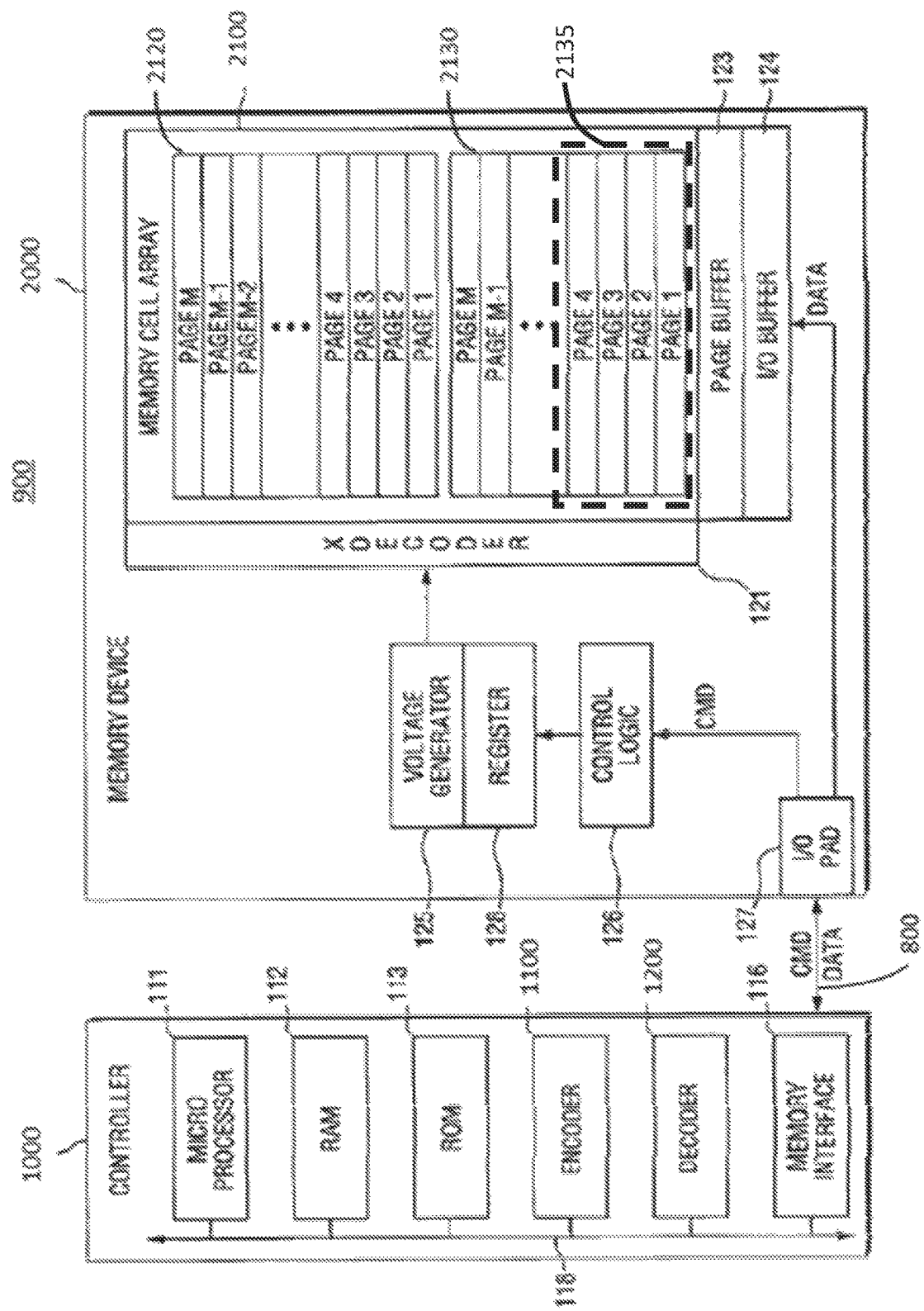
FIG. 1A is a diagram showing a memory system according to at least one example embodiment of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

I. Overview

For PRAM devices, amounts of power needed to perform single memory cell write and read operations may be relatively low and competitive with respect to memory devices of other memory technology types. However, when a PRAM device includes a memory cell array in which multiple memory cells are packed into a dense cross-point array architecture, memory operations, such as write operations, performed by the PRAM device may consume relatively high amounts of power due to the effects of unselected memory cells on power consumption. For example, in a SET and/or RESET operation performed on memory cells of a memory cell array of a PRAM device, the amount power consumed at each unselected memory cell in the memory cell array may be, for example, the square of the applied voltage, divided by the memory cell's resistance. Thus, when a large gap (e.g., a factor of 100) exists between the resistance RL of the memory cells in a low resistance state (LRS) and the resistance RH of the memory cells in the high resistance state (HRS), an amount of power consumed during a SET and/or RESET operation may be largely affected by the number of low-resistance cells in the whole cells array matrix.

The relatively high power consumption discussed above may offset advantages PRAM devices have over memory devices of other memory technology types. Accordingly, it would be advantageous to reduce an amount of power consumed by a PRAM device during writing operations (i.e., SET and/or RESET operations) by mitigating the power consumption caused by the unselected memory cells during a write operation.

Conventional methods of attempting to optimize write power focus on voltage-level optimization with respect to an operation of writing to a single word line.

In the following word line/bit line (WL/BL) powering schemes (i.e., schemes of applying power to word lines and bit lines of a PRAM device during SET and/or RESET operations), suitable voltages are applied to the word line and bit line(s) of the target cell(s) of the PRAM device in essentially the same manner for each scheme, but the manner in which voltages are applied to unselected word lines and bit lines of the PRAM device varies between schemes. For example, according to a floating word lines/ floating bit lines (FWFB) scheme, all unselected rows and columns (i.e., unselected word lines and bit lines) are floated (i.e., controlled to assume a floating state). According to a half-power word lines/floating bit lines (HWFB) scheme, a voltage having half the magnitude of a write voltage is applied to the unselected word lines, and the unselected bit lines are floated. According to a floating word lines/half-power bit lines (FWHB) scheme, the unselected word lines are floated, and a voltage having half the magnitude of the write voltage is applied to the unselected bit lines. Further, according to a half-power word lines/half-power bit lines (HWHB) scheme, a voltage having half the magnitude of the write voltage is applied to the unselected bit lines, and a voltage having half the magnitude of the write voltage is applied to the unselected bit lines.

An analysis of the above-referenced BL/WL schemes indicated that the HWHB is the most energy efficient among the above-referenced BL/WL schemes.

Further, according to at least some example embodiments of the inventive concepts, the energy efficiency of performing a write operation on memory cells of a PRAM device may be further enhanced by performing the write operation on a block-level or sub-block level, instead of performing the write operation on only a word line-level.

For example, according to at least some example embodiments of the inventive concepts, as will be discussed in greater detail below, performing a block-level write operation may include (i) erasing (i.e., performing a RESET operation) an entire block of memory cells to set the memory cells to a high resistance state (HRS) before (ii) writing data to the memory cells of the block by performing a SET operation, sequentially, on individual word lines of the block in order to selectively set memory cells in each word line to a low resistance state (LRS) in accordance with the data being written. As will be demonstrated below, block-level write operations according to at least some example embodiments of the inventive concepts are more energy efficient than word line-level write operations.

Further, according to at least some example embodiments of the inventive concepts, as will be discussed in greater detail below, performing a sub-block-level write operation on may include (i) erasing (i.e., performing a RESET operation) on a memory cells of a sub-block (e.g., some but not all word lines of a block) to set the memory cells to a high resistance state (HRS) before (ii) writing data to the memory cells of the block by performing a SET operation, sequentially, on individual word lines of the block in order to selectively set memory cells in each word line to a low resistance state (LRS) in accordance with the data being written. As will be demonstrated below, sub-block-level write operations according to at least some example embodiments of the inventive concepts are more energy efficient than word line-level write operations.

FIG. 1A is a diagram showing a memory system 900 according to at least one example embodiment of the inventive concepts. Referring to FIG. 1A, the memory system 900 includes the memory controller 1000 and a nonvolatile memory device 2000.

According to at least some example embodiments of the inventive concepts, the nonvolatile device 2000 is a phase-change RAM (PRAM) device. The nonvolatile memory device 2000 may also be referred to, in the present disclosure, as the PRAM device 2000.

The PRAM device 2000 may include a memory cell array 2100, an X decoder 121, a voltage generator 125, an I/O buffer 124, a page buffer 123, and a control logic 126 each of which may be implemented as one or more circuits. The memory device may also include an input/output (I/O) pad 127.

As is discussed in greater detail below with respect to FIG. 1D, the memory cell array 2100 may be a PRAM cell array that includes a plurality of word lines and a plurality of bit lines, and each memory cell in the memory cell array 2100 may be implemented, for example, as a PRAM cell.

The memory cell array 2100 may include a plurality of blocks and a plurality of pages. One block includes a plurality of pages. According to at least some example embodiments of the inventive concepts, a page may refer to the memory cells of a word line. Thus, as used in the present disclosure, the term "page" may be considered synonymous with, and may be occasionally referred to as, a "word line." According to at least some example embodiment of the inventive concepts, a page may be a unit of write and/or read operations. For example, the memory cell array 2100 includes a first block 2120 and a second block 2130. As is illustrated n FIG. 1A, the first block 2120 includes pages 1-M, and the second block 2130 includes pages 1-M, where M is a positive integer greater than 1. According to at least some example embodiments, the M pages included in the first block 2120 correspond, respectively, to M word lines included in the first block 2120, and the M pages included in the second block 2130 correspond, respectively, to M word lines included in the second block 2130.

According to at least some example embodiments of the inventive concepts, a sub-group of pages (or word lines) in a block may be referred to in the present disclosure as a "sub-block." For example, as is illustrated in FIG. 1A, the second block 2130 includes a sub-block 2135. The sub-block 2135 includes 4 pages, pages 1-4 of the second block 2130. The sub-block 2135 may also be referred to as including the 4 word lines corresponding, respectively, to pages 1-4 of the second block 2130.

The control logic 126 controls the overall operation of the PRAM device 2000. When receiving a command CMD from the memory controller 1000, the control logic 126 interprets the command CMD and controls the PRAM device 2000 to perform an operation (e.g., a program operation, a read operation, a read retry operation, or an erase operation) according to the interpreted command CMD.

According to at least one example embodiment, the control logic 126 may include a hardware-implemented processor configured to execute commands based on command signal CMD. According to at least one example embodiment of the inventive concepts, in addition to the processor, the control logic 126 may also include a storage unit for storing steps that, when executed by the processor included in the control logic 126, cause the processor to perform specific operations. According to at least one example embodiment of the inventive concepts, any operations described herein as being performed by the memory device 2000 may be performed by, or under the control of, the control logic 126, for example, by the processor included in the control logic 126 driving firmware stored in the storage unit included in the control logic 126. Alternatively, the control logic 126 may be a circuit (e.g. an application specific integrated circuit (ASIC)) that is physically programmed, in terms of hardware, to perform or control any operations described herein as being performed by the memory device 2000.

The X decoder 121 is controlled by the control logic 126 and drives at least one of the word lines in the memory cell array 2100 according to a row address.

The voltage generator 125 is controlled by the control logic 126 to generate one or more voltages required for a write operation, a read operation or an erase operation and provide the generated voltages to one or more rows selected by the X decoder 121.

A register 128 is controlled by the control logic 126, is a space in which information input from the memory controller 1000 is stored, and may include a plurality of latches. For example, the register 128 may group read voltage (and/or reference voltage) information and store the information in the form of a table.

The page buffer 123 is controlled by the control logic 126 and operates as a sense amplifier or a write driver according to an operation mode (e.g., a read operation or a write operation).

The I/O pad 127 and the I/O buffer 124 may serve as I/O paths of data exchanged between an external device, e.g., the memory controller 1000 or a host and the PRAM device 2000. The I/O pad 127 is connected to the controller 1000 through a memory system bus 800. Data and or commands may be output from memory device 2000 to the controller 1000 or received from the controller 1000 at the memory device 2000 via the I/O pad 127 and the memory system bus 800.

According to at least some example embodiments of the inventive concepts, the memory device 2000 operates in response to commands and/or control signals generated by the memory controller 1000. Thus, operations described in the present disclosure as being performed, executed or controlled by the memory device 2000 may be referred to, additionally or alternatively, as operations that are performed, executed or controlled by the memory controller 1000.

The memory controller 1000 may include a microprocessor 111, a read-only memory (ROM) 113, a random access memory (RAM) 112, an encoder 1100, a decoder 1200, a memory interface 116, and a controller bus 118. The elements 111 through 116 of the memory controller 1000 may be electrically connected to each other through the controller bus 118.

The microprocessor 111 controls the overall operation of the memory system 900 including the memory controller 1000. The microprocessor 111 is a circuit that controls other elements by generating control signals. When power is supplied to the memory system 900, the microprocessor 111 drives firmware (e.g., stored in the ROM 113) for operating the memory system 900 on the RAM 112, thereby controlling the overall operation of the memory system 900. According to at least one example embodiment of the inventive concepts, the microprocessor 111 may also issue commands, or output control signals, for controlling operations of other elements of the memory controller 1000 including, for example, some or all of the ROM 113, RAM 112, encoder 1100, decoder 1200, memory interface 116, and controller bus 118. According to at least one example embodiment of the inventive concepts, any operations described herein as being performed by the memory controller 1000 may be performed by, or under the control of, the microprocessor 111, for example, by the microprocessor driving the above-referenced firmware.

While a driving firmware code of the memory system 900 is stored in the ROM 113, one or more example embodiments of the inventive concepts are not limited thereto. The firmware code can also be stored in a portion of the memory system 900 other than the ROM 113. Therefore, the control or intervention of the microprocessor 111 may encompass not only the direct control of the microprocessor 111 but also the intervention of firmware which is software driven by the microprocessor 111.

Alternatively, the microprocessor 111 may be a circuit (e.g. an (ASIC)) that is physically programmed, in terms of hardware, to perform or control any operations described herein as being performed by the memory controller 1000.

The RAM 112, which is a memory serving as a buffer, may store an initial command, data, and various variables input from a host or the microprocessor 111, or data output from the PRAM device 2000. The RAM 112 may store data and various parameters and variables input to and output from the PRAM device 2000. According to at least some example embodiments of the inventive concepts.

The memory interface 116 may serve as an interface between the memory controller 1000 and the PRAM device 2000. The memory interface 116 is connected to the I/O pad 127 of the PRAM device 2000 via the memory system bus 800 and may exchange data with the I/O pad 127 via the memory system bus 800. In addition, the memory interface 116 may create a command suitable for the PRAM device 2000 and provide the created command to the I/O pad 127 of the PRAM device 2000. The memory interface 116 provides one or more commands to be executed by the PRAM device 2000 and one or more addresses ADD of the PRAM device 2000.

Figure 1B:
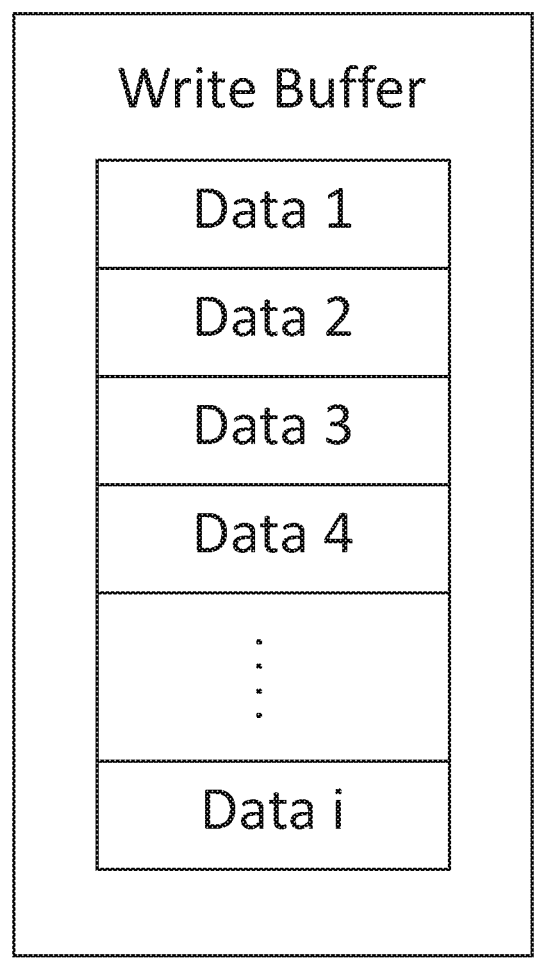
FIG. 1B illustrates a write buffer according to at least some example embodiments of the inventive concepts.

FIG. 1B illustrates a write buffer 150 according to at least some example embodiments of the inventive concepts. The memory controller 1000 may store multiple units of write data in the write buffer 150. For example, according to at least some example embodiments, the memory controller 1000 may store up to i units of data, Data 1-Data i, before providing the i units of data to the PRAM device 2000, for a write operation. According to at least some example embodiments of the inventive concepts, the units by which data is stored in the write buffer are pages. Thus, according to at least some example embodiments of the inventive concepts, the memory controller 1000 may store i pages of write data in the write buffer 150 before providing the i pages of write data to the memory controller 1000 for a multi-page write operation.

FIG. 1C illustrates a validity table 160 according to at least some example embodiments of the inventive concepts. The memory controller 1000 may store, in the validity table 160, meta data indicating, for each page (e.g., word line) of each block in the memory cell array 2100, whether the page is valid (V) or invalid (I). According to at least some example embodiments of the inventive concepts, the memory controller 1000 may determine whether each page in the memory cell array 2100 is valid or invalid based on, for example, a relationship between the data stored in the pages of the memory cell array 2100 and data of logical pages (e.g., of a host) that correspond to the pages of the memory cell array 2100, which are physical pages. For example, when the data of a physical page in the memory cell array 2100 matches the data of a corresponding logical page, the memory controller 1000 may identify the physical page as valid (V) in the validity table 160. Further, when the data of a physical page in the memory cell array 2100 does not match the data of a corresponding logical page, or the physical page has not yet been assigned to a corresponding logical page, the memory controller 1000 may identify the physical page as invalid (I) in the validity table 160. For example, in the example illustrated in FIG. 1C, all M pages of Block 1 are valid (V) except invalid (I) pages, Page 1 and Page M; all M pages of Block 2 are valid (V) except invalid (I) pages, Page 1 and Page 2; all M pages of Block 3 are invalid (I); and all M pages of Block 4 are valid (V).

According to at least some example embodiments of the inventive concepts, one or both of the write buffer 150 and the validity table 160 may be implemented by a portion of the RAM 112. According to at least some example embodiments of the inventive concepts, one or both of the write buffer 150 and the validity table 160 may be a device that is separate from the RAM 112, and is inside or outside the controller 1000.

Figure 1D:
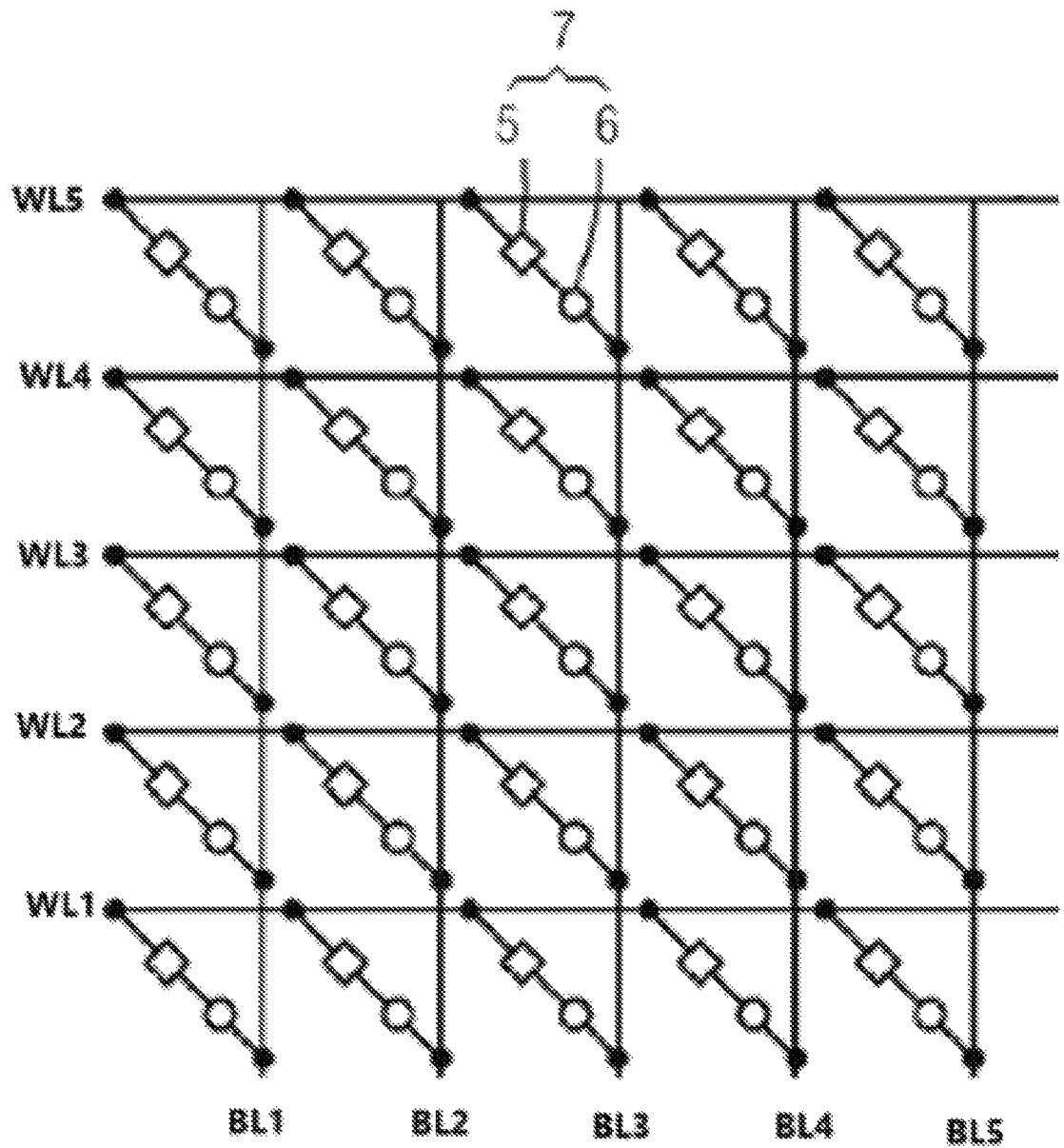
FIG. 1D illustrates a portion of a memory cell array according to at least one example embodiment of the inventive concepts.

FIG. 1D illustrates a portion of a memory cell array 200 according to at least one example embodiment of the inventive concepts. According to at least one example embodiment of the inventive concepts, the memory cell array 200 is a PRAM cell array and is an example of a portion of the memory cell array 2100 illustrated in FIG. 1A. Referring to FIG. 1D, memory cell array 200 includes a plurality of memory cells 7 that are arranged in a matrix and each of which includes a memory element 5 and an access device 6. The memory element 5 may include, for example, a phase-change material. The memory element 5 may also be referred to, in the present disclosure, as phase-change element 5. The state of the memory element 5 may vary according to the amount of current supplied thereto.

For example, as is known in the field of PRAM devices, the phase-change material of the phase-change element 5 may be a material whose physical state, and thus, resistivity, changes in response to the application of a current to the material. For example, according to at least some example embodiments, the phase-change element 5 may have a crystalline state when the phase-change material is heated to a temperature between a crystallization temperature and a melting point thereof for a predetermined time and is then gradually cooled. Further, the phase-change element 5 may have an amorphous state when the phase-change element 5 is heated to a temperature that is equal to, or greater than, the melting point thereof and is then quickly cooled. The crystalline and amorphous states may have different resistivities, relative to each other. For example, the phase-change element 5 may be in a high resistance state (HRS) when in the amorphous state and may be in a low resistance state (LRS) when in the crystalline state.

The access device 6 controls the supply of current to the phase-change element 5 according to a voltage of a word line (not shown). In various embodiments, the access device 6 may be, for example, a diode, a transistor (e.g., a metal oxide semiconductor field effect transistor (MOSFET) or bipolar junction transistor (BJT)), or any other known suitable switching device.

The plurality of memory cells 7 are electrically connected to first through fifth word lines WL1-WL5 and first through fifth bit lines BL1-BL5, respectively. The memory cell array 200 is a cross-point memory cell array. According to at least some example embodiments of the inventive concepts, the word lines WL the bit lines BL are arranged in two-dimensions, for example, in the shape of a grid. For example, the word lines WL and the bit lines BL may be arranged in two-dimensions at right angles. According to at least some example embodiments of the inventive concepts, the word lines WL and the bit lines BL may be arranged in two-dimensions at angles other than right angles. In at least some example embodiments of the inventive concepts, the word lines WL and the bit lines BL are arranged transversely relative to each other. Though, for ease of description, FIG. 1D illustrates only five word lines and five bit lines of the memory cell array 200, the memory cell array 200 may include any number of word lines and any number of bit lines.

Figure 2A:
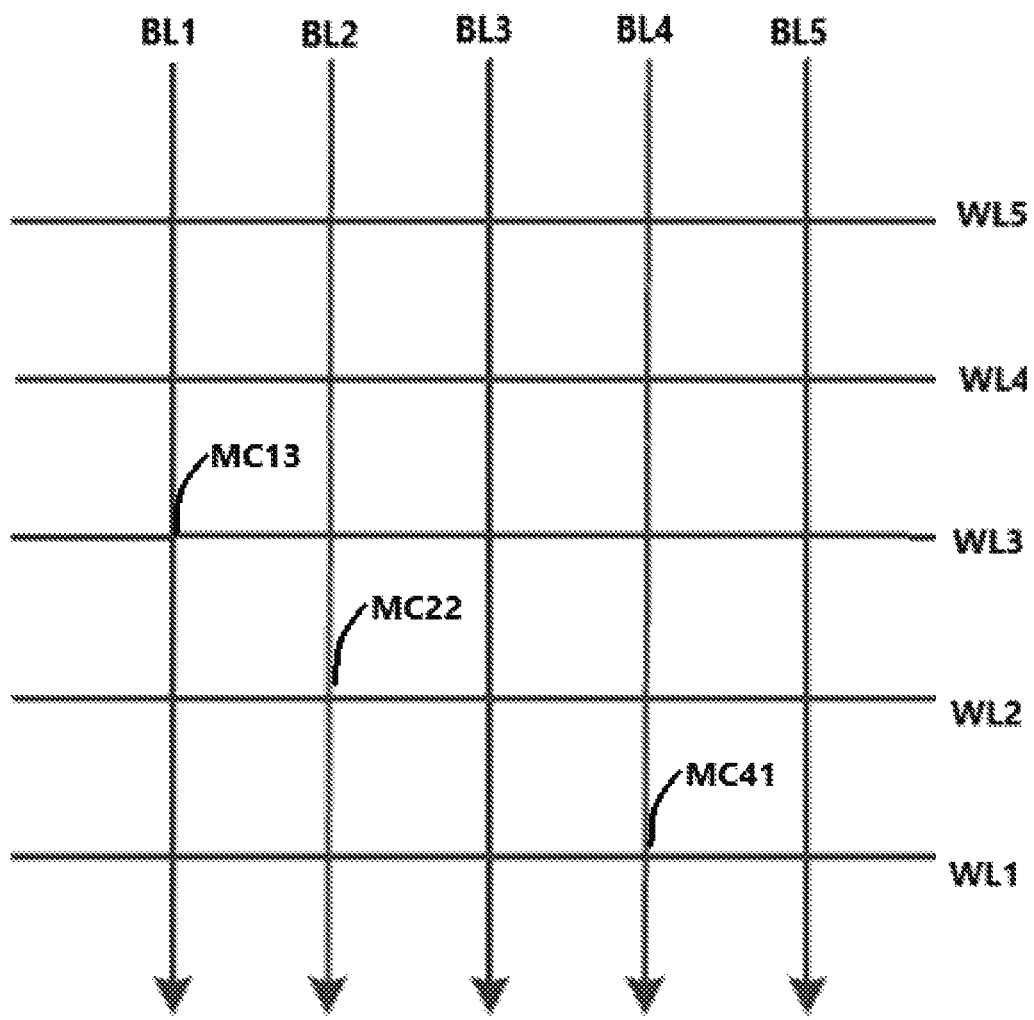
FIG. 2A illustrates a portion of a phase-change memory cell array according to at least some example embodiments.

FIG. 2A illustrates a portion of a memory cell array 300 according to at least some example embodiments of the inventive concepts. The memory cell array 300 illustrated in FIG. 2A is a simplified depiction of the memory cell array 200 illustrated in FIG. 1D.

For example, each intersection between a bit line and a word line in FIG. 2A corresponds to a memory cell that is connected to both of the intersecting lines. For example, as used in the present disclosure, the notation MCxy refers to a memory cell that is connected to bit line BLx and word line WLy. For example, as is illustrated in FIG. 2A, the intersection of the first bit line BL1 and the third word line WL3 corresponds to a memory cell MC13, which is connected to, and in between, the first bit line BL1 and the third word line WL3; the intersection of the second bit line BL2 and the second word line WL2 corresponds to memory cell MC22, which is connected to, and in between, the second bit line BL2 and the second word line WL2; and the intersection of the fourth bit line BL4 and the first word line WL1 corresponds to a memory cell MC41, which is connected to, and in between, the fourth bit line BL4 and the first word line WL1.

The memory cells MC in the memory cell array 300 are examples of the memory cells 7 in the memory cell array 200 of FIG. 1D. Thus, according to at least some example embodiments of the inventive concepts, each memory cell MC in the memory cell array 300 is a PRAM cell including a phase-change element 5 and access device 6.

Figure 2B:
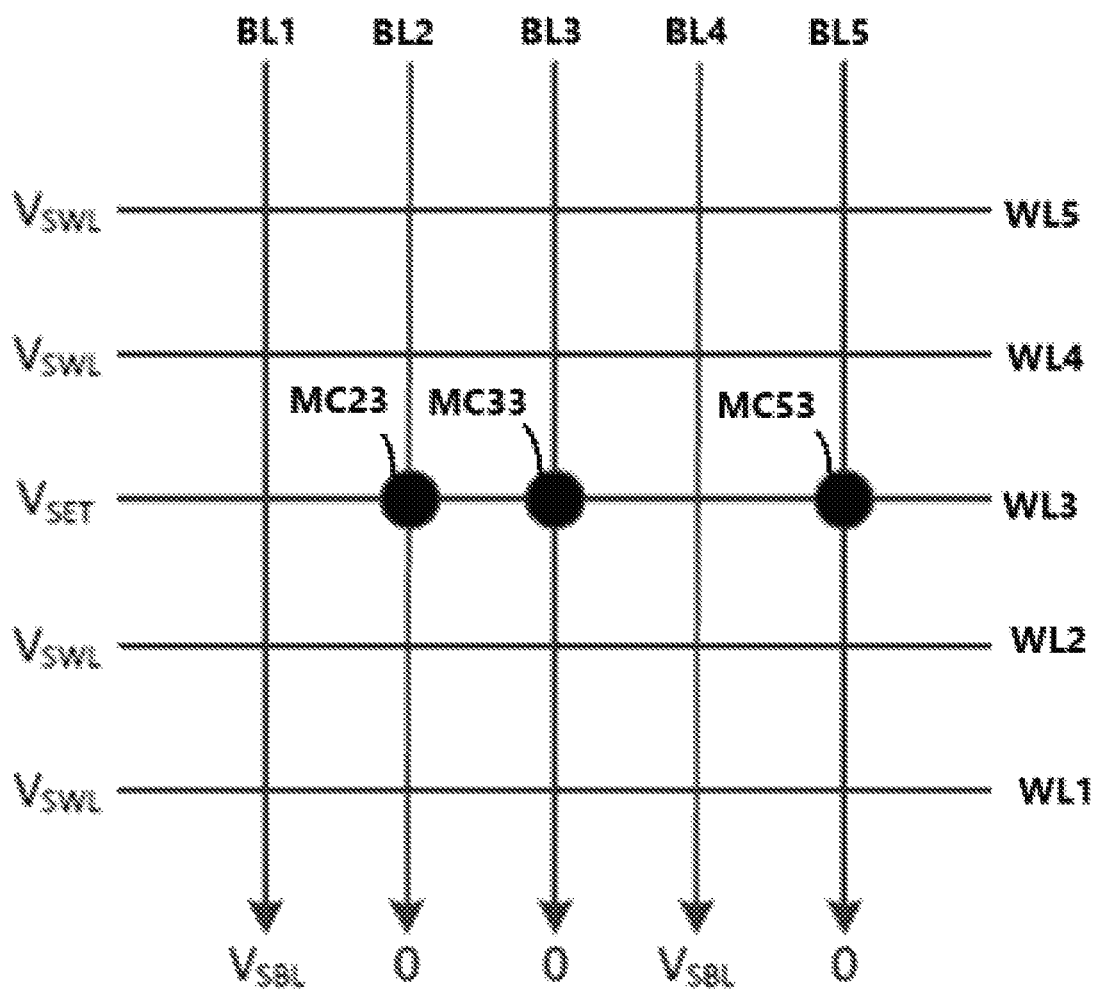
FIG. 2B illustrates an example SET operation according to at least some example embodiments of the inventive concepts.
Figure 2C:
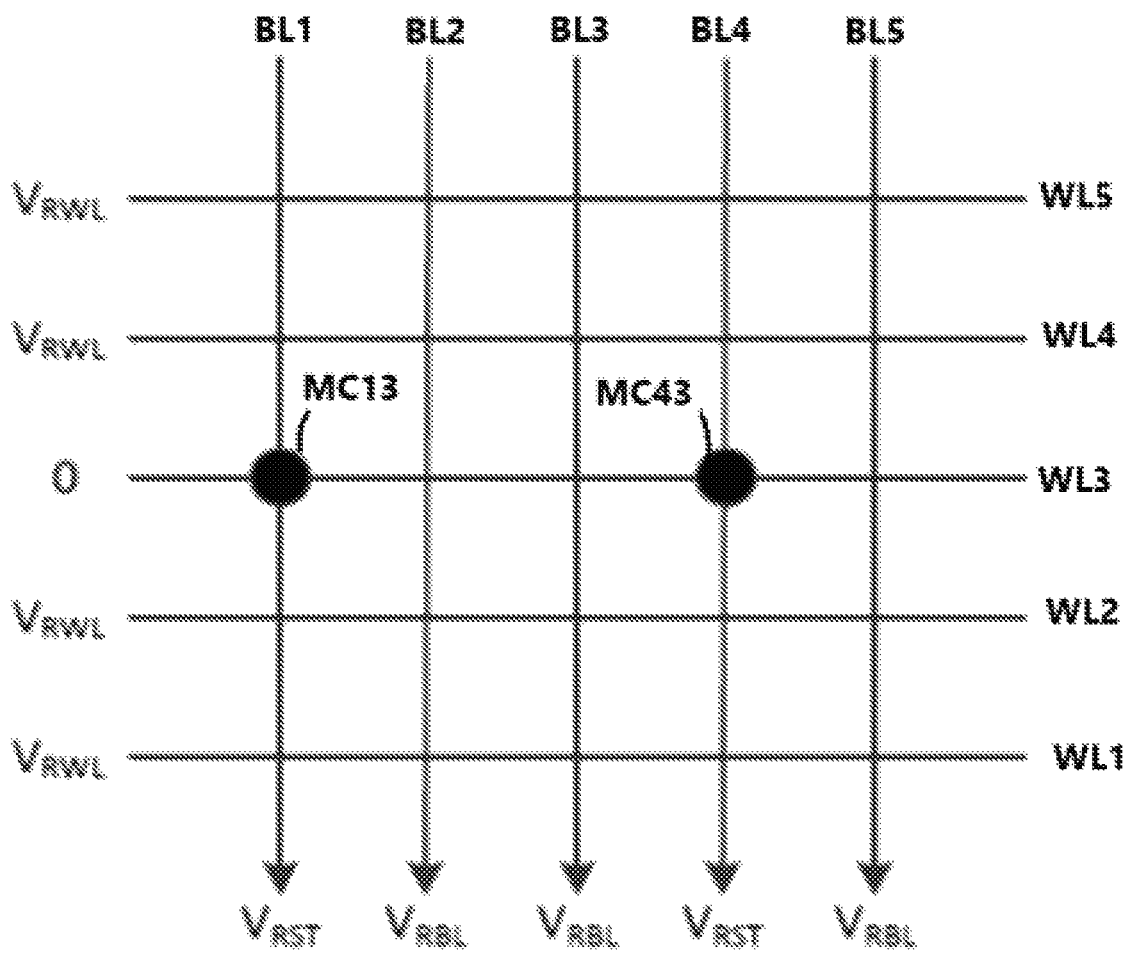
FIG. 2C illustrates an example RESET operation according to at least some example embodiments of the inventive concepts.

An operation of transitioning a PRAM cell from a low resistance state (LRS) to a high resistance state (HRS) is called a RESET operation. An operation of transitioning a PRAM cell from an HRS to an LRS is called a SET operation. The RESET and SET operations will now be discussed in greater detail below, with reference to FIGS. 2B and 2C. FIG. 2B illustrates an example SET operation according to at least some example embodiments of the inventive concepts. FIG. 2C illustrates an example RESET operation according to at least some example embodiments of the inventive concepts.

Referring to FIG. 2B, in order to perform a SET operation on a target memory cell by switching the target cell from a HRS to a LRS, the PRAM device 2000 may create a relatively high voltage drop between the corresponding target word line and target bit line (i.e., the word line and bit line connected to the target memory cell). Accordingly, the voltages applied to the target word line and target bit line during a SET operation are chosen so as to create a desired voltage drop. In the example illustrated in FIG. 2B, the target memory cells are memory cells MC23, MC33 and MC53, as is indicated by the dark, solid circles in FIG. 2B. Thus, the target bit lines are the second, third and fifth bit lines BL2, BL3 and BL5, and the target word line is third word line WL3. Further, as is illustrated in FIG. 2B, the PRAM device 2000 applies a ground voltage (e.g., 0V) to the target bit lines, and applies a set voltage VSET to the target word line, third word line WL3. Thus, for each target memory cell, a voltage drop is created from the node of the target memory cell connected to the word line of the target memory cell to the node of the target memory cell connected to the bit line of the target memory cell. Thus, in the example illustrated in FIG. 2B, the resulting resistance states of the target memory cells MC23, MC33 and MC53 become the LRS. For example, the resistances of the target memory cells MC23, MC33 and MC53 after the SET operation may be the resistance RL.

During the SET operation, the voltages applied to the target word line and the target bit lines may cause unintended voltage variations in the memory cells of the unselected word lines and the unselected bit lines. Thus, according to at least some example embodiments of the inventive concepts, in order to reduce the above-referenced unintended voltage variations, during the SET operation, the PRAM device 2000 applies the voltage VSBL to the unselected bit lines, first and fourth bit lines BL1 and BL4, and applies the voltage VSWL to the unselected word lines, first, second, fourth and fifth word lines WL1, WL2, WL4 and WL5, as is illustrated in FIG. 2B. According to at least some example embodiments of the inventive concepts, the magnitudes of the voltages VSBL (e.g., 1V) and VSWL (e.g., 1V) may each be equal to half of the magnitude of the set voltage VSET (e.g., 2V).

Referring to FIG. 2C, in order to perform a RESET operation on a target memory cell by switching the target cell from a LRS to a HRS, the PRAM device 2000 may create a relatively high voltage drop between the corresponding target bit line and target word line (i.e., the bit line and word line connected to the target memory cell). Accordingly, the voltages applied to the target bit line and target word line during a RESET operation are chosen so as to create a desired voltage drop. In the example illustrated in FIG. 2C, the target memory cells are memory cells MC13 and MC43, as is indicated by the dark, solid circles in FIG. 2C. Thus, the target bit lines are the first and fourth bit lines BL1 and BL4, and the target word line is third word line WL3. Further, as is illustrated in FIG. 2C, the PRAM device 2000 applies a ground voltage (e.g., 0V) to the target word line WL3, and applies a reset voltage VRST to the target bit lines, BL1 and BL4. Thus, for each target memory cell, a voltage drop is created from the node of the target memory cell connected to the bit line of the target memory cell to the node of the target memory cell connected to the word line of the target memory cell. Thus, in the example illustrated in FIG. 2C, the resulting resistance states of the target memory cells MC13 and MC43 become the HRS. For example, the resistances of the target memory cells MC13 and MC43 after the RESET operation may be the resistance RH.

During the RESET operation, the voltages applied to the target word line and the target bit lines may cause unintended voltage variations in the memory cells of the unselected word lines and unselected bit lines. Thus, according to at least some example embodiments of the inventive concepts, in order to reduce the above-referenced unintended voltage variations, during the RESET operation, the PRAM device 2000 applies the voltage VRBL to the unselected bit lines, second, third and fifth bit lines BL2, BL3 and BL5, and applies the voltage VRWL is applied to the unselected word lines, first, second, fourth and fifth word lines WL1, WL2, WL4 and WL5, as is illustrated in FIG. 2C. According to at least some example embodiments of the inventive concepts, the magnitudes of the voltages VRBL (e.g., 1V) and VRWL (e.g., 1V) may each be equal to half of the magnitude of the reset voltage VRST (e.g., 2V).

Power consumption attributes associated with different schemes for performing a write operation on PRAM cells of a PRAM device will now be discussed in greater detail below. Section II includes a discussion of parameters, example values, notations and definitions that are used throughout the present disclosure. Section III includes an analysis of various single word line write schemes. Section IV includes an analysis of various block and sub-block write schemes. Section V includes discussions of algorithms for performing write operations on PRAM cells of a PRAM device according to at least some example embodiments of the inventive concepts.

II. Notations and Definitions

Table 1, below, explains notation that will be used for certain parameters in the present disclosure, as well as an example value and unit for each parameter. The values and units provided for the parameters in Table 1 are examples provided for ease of explanation, and the parameters listed in Table 1 are not limited to the provided values and units. Accordingly, the values and units of the parameters listed in Table 1 may be different than those shown in Table 1. For example, according to at least some example embodiments of the inventive concepts, the parameters listed in Table 1 may have values and units that are set in accordance with the preferences of a designer, manufacturer and/or user of the phase-change memory device 1, for example, based on an empirical analysis of the parameters.

TABLE 1

| Parameter | Value | Units | Definition |
|---|---|---|---|
| M | 128 | Rows | Number of rows in a PRAM block |
| N | 16384 | Columns | Number of columns in a PRAM block (~2 KB) |
| VSET or $V_{SET}$ | 2 | Volts(V) | Voltage applied to target word line during SET operation. |
| VRST or $V_{RST}$ | 2 | Volts(V) | Voltage applied to target bit line during RESET operation. |
| VRD or $V_{RD}$ | 0.5 | Volts(V) | Voltage applied to target word line during read operation. |
| VSWL or $V_{SWL}$ | 1 | Volts(V) | Voltage applied to unselected word line during SET operation. |
| VSBL or $V_{SBL}$ | 1 | Volts(V) | Voltage applied to unselected bit line during SET operation. |
| VRWL or $V_{RWL}$ | 1 | Volts(V) | Voltage applied to unselected word line during RESET operation. |
| VRBL or $V_{RBL}$ | 1 | Volts(V) | Voltage applied to unselected bit line during RESET operation. |
| RL or RL | 100 | Kilo ohms(KΩ) | Resistance of PRAM cell in LRS. |
| RH or RH | 1000 | Kilo ohms(KΩ) | Resistance of PRAM cell in HRS. |

Notations and definitions used throughout the present disclosure will now be explained below.

Notation 1 (Array Dimensions and Data Distribution): The examples discussed below in sections III-V are discussed with respect to a scenario in which the memory controller 1000 of FIG. 1A controls the memory device 2000 of FIG. 1A to program desired write data into the PRAM cells of the memory cell array 2100 of the memory device 2000, using the second block 2130 and/or the sub-block 2135 of the second block 2130 as examples. Thus, all operations discussed in sections III-V may be performed by the memory device 2000, for example, under the control of the memory controller 1000. Further, the examples discussed below in sections III-V are discussed with respect to a scenario in which the memory cell array 2100 is a cross-point array, which includes M word lines (rows) and N bit lines (columns), where M and N are each positive, non-zero integers. Further, the examples discussed below in sections III-V are discussed with respect to a scenario in which the data distribution is assumed to be Bernoulli-(½) (i.e., for each word line to which write data has been written, it is assumed that the word line has an equal number of 0's and 1's). Further, in the present disclosure, word lines and bit lines may be referred to, on occasion, using the abbreviations "WL" and "BL," respectively. Additionally, in the present disclosure, word lines and bit lines may be referred to, on occasion, using the terms "rows" and "columns," respectively.

Notation 2 (PRAM Cell's States): For the purpose of simplicity, the examples discussed below in section III and IV are discussed with respect to a scenario in which the PRAM cells of the memory cell array 2100 are each single level cells (SLCs), capable of storing a single bit of data by being in a high resistance state (HRS) corresponding to the binary value "1" or a low resistance state (LRS) corresponding to the binary value "0." However, according to at least some example embodiments of the inventive concepts, the HRS and LRS are not limited to representing binary values "1" and "0," respectively. For example, according to at least one alternative example embodiment, the LRS could correspond to a binary value of "1" and the HRS could correspond to a binary value of "0." Further, according to at least some example embodiments of the inventive concepts, the PRAM cells of the memory cell array 2100 may be multi-level cells (MLCs) each storing more than one bit of data. For example, PRAM cells of the memory cell array 2100 may be MLCs each storing two bits of data (e.g., "11," "10," "00," or "01") by storing one of 4 different resistance states (e.g., a HRS, a high intermediate resistance state (HIRS), a low intermediate resistance state (LIRS), and a LRS). Further, according to at least some example embodiments of the inventive concepts, the PRAM cells of the memory cell array 2100 may include a mixture of SLCs and MLCs. The examples discussed below in sections III-V are primarily discussed with respect to a scenario in which a PRAM cell having the LRS corresponds to the PRAM cell storing a binary value of "0" and a PRAM cell having the HRS corresponds to the PRAM cell storing a binary value of "1."

Notation and Definition 3 (Write Operation and Voltages): Each write operation consists of two steps: SET and RESET (or vice versa). The PRAM 2000 applies voltages to WLs and BLs of the memory cell array 2100 during the SET and RESET operations in the same manner discussed above with respect to FIGS. 2B and 2C. For example, during the SET operation, the set voltage VSET is applied to the target WL, the cells that are being written to RL have their bit lines grounded (0v), and the unselected WLs and BLs are powered with the voltages VSWL and VSBL. Further, in the RESET phase, target WL is grounded (0v), the reset voltage VRST is applied to the BLs of cells that are being written to RH, and the unselected WLs and BLs are powered with the voltages VRWL and VRBL, respectively. The examples discussed below in section III and IV will be discussed with respect to a scenario in which each parameter listed in Table 1 is set to have the example value and unit listed for the parameter in Table 1.

Notation and Definition 4 (Write Power of a Single Memory Cell): The required power (PRST or PRST) for changing a single PRAM cell's resistance state from the LRS to the HRS (e.g., as part of performing a RESET operation on the WL of the PRAM cell) is assumed to be expressed by Equation 1, below:

$$P_{RST} = \int_{R_L}^{R_H} I(R) V_{RST} dR, \qquad (1)$$

where I(R) is the current through the PRAM cell at resistance R.

The required power (PSET or $-P_{SET}$) for changing a single PRAM cell's resistance state from the HRS to the LRS (e.g., as part of performing a SET operation on the WL of the PRAM cell) is assumed to be expressed by Equation 2, below:

$$P_{SET} = \int_{R_H}^{R_L} I(R) V_{SET} dR. \qquad (2)$$

The latencies of the SET and RESET operations (i.e., tSET and tRST, respectively) are assumed to be substantially the same or, alternatively, the same (i.e., tSET=tRST), and therefore the energy is proportional to power. In a case where latencies of the SET and RESET operations are different from each other, energy data may be derived, for example, by multiplying the power with the corresponding time duration.

Notation and Definition 5 (Read Operation and Power): The examples discussed below in section III and IV will be discussed with respect to a scenario in which a read operation is performed by powering the target WL with the read voltage VRD when all BLs are grounded (0v). Further, the read operation includes measuring the current at each BL in order to determine the resistance state (i.e., LRS or HRS) of each corresponding PRAM cell. The power (PRD or $P_{RD}$) of the read operation (with random data distribution) is expressed by Equation 3:

$$P_{RD} = \frac{N}{2} V_{RD}^2 \left( \frac{1}{R_L} + \frac{1}{R_H} \right). \tag{3}$$

The read power PRD may include a parasitic component that originates from a sneak current. The parasitic component is assumed to be a fraction of the read power PRD that is considered to be negligible when in comparison to overall power consumption of the write operation, and thus, is not included in the calculations of overall power consumption of the various write operations discussed in sections III and IV.

An analysis of various single word line write schemes will now be provided below in section III.

III. Analysis of Single Word Line Write Schemes

Below, write operation power consumption is analyzed with respect to four different single word line write schemes: RESET-before-SET without prior read; SET-before-RESET without prior read; RESET-before-SET with prior read; and SET-before-RESET with prior read.

1) RESET-Before-SET without Prior Read

In the RESET phase, the memory cells of N/2 target columns, from among the memory cells of the target WL, are selected to be reset to the HRS according to incoming data. However, the targeted memory cells of half of the target N/2 columns, from among the memory cells of the target WL, are already set to the HRS. Thus, only the target memory cells of N/4 target columns are affected (i.e., experience a change in resistance state) and the target memory cells of the remaining N/4 target columns merely consume redundant power. The remaining N/2 unselected columns are powered by the voltage VRBL, which is distributed among the LRS and HRS cells of the N/2 unselected columns. Unselected rows have half of their cells biased with VRST-VRWL and the other half with VRBL-VRWL. The states of the cells of each unselected row are equally divided between the HRS and the LRS. Thus, the RESET operation power of the RESET-before-SET without prior read scheme ($P_{RBS-RST}$) is expressed by Equation 4:

$$P_{RBS-RST} = \frac{N}{4} P_{RST} + \frac{N}{4} \frac{V_{RST}^2}{R_H} + \frac{N}{2} V_{RBL}^2 \left( \frac{1}{2R_L} + \frac{1}{2R_H} \right) + \tag{4}$$
$$(M-1) \left[ \frac{N}{2} (V_{RST} - V_{RWL})^2 \left( \frac{1}{2R_L} + \frac{1}{2R_H} \right) + \right.$$
$$\left. \frac{N}{2} (V_{RBL} - V_{RWL})^2 \left( \frac{1}{2R_L} + \frac{1}{2R_H} \right) \right].$$

After the RESET operation, the SET operation is performed. During the SET operation, the BLs of the remaining N/2 cells of the target WL (i.e., the N/2 cells other than the N/2 cells that were previously selected to be reset to the HRS during the above-referenced RESET operation) are selected to be set to the LRS. However, half of the cells that are selected to be set to the LRS are already in LRS and will not experience a change in resistance state during the SET operation. The unselected cells on the target word line, which are biased with VSET-VSBL, are already in the HRS, and thus, consume less power. The cells in the unselected word lines are evenly divided between being biased with the voltage VSWL (i.e., VSWL-0) or the voltage VSWL-VSBL, in equal numbers. Thus, the SET operation power of the RESET-before-SET without prior read scheme ($P_{RBS-SET}$) is expressed by Equation 5:

$$P_{RBS-SET} = \frac{N}{4} P_{SET} + \frac{N}{4} \frac{V_{SET}^2}{R_L} + \frac{N}{2} (V_{SET} - V_{SBL})^2 \frac{1}{R_H} + \tag{5}$$
$$(M-1) \left[ \frac{N}{2} V_{SWL}^2 \left( \frac{1}{2R_L} + \frac{1}{2R_H} \right) + \frac{N}{2} (V_{SWL} - V_{SBL})^2 \left( \frac{1}{2R_L} + \frac{1}{2R_H} \right) \right],$$

and thus, the total power $P_{RBS}$ of the RESET-before-SET without prior read scheme is expressed by Equation 6:

$$P_{RBS} = P_{RBS-RST} + P_{RBS-SET} \tag{6}.$$

2) SET-Before-RESET without Prior Read

The difference between the present SET-before-RESET without prior read write scheme and the RESET-before-SET without prior read write scheme discussed immediately above is in the resistance of unselected cells in target word line. During the SET operation, the unselected N/2 cells of the target word line are now equally distributed between the LRS and HRS. Thus, the SET operation power ($P_{SBR-SET}$) of the SET-before-RESET without prior read write scheme is expressed by Equation 7:

$$P_{SBR-SET} = \frac{N}{4} P_{SET} + \frac{N}{4} \frac{V_{SET}^2}{R_L} + \frac{N}{2} (V_{SET} - V_{SBL})^2 \left( \frac{1}{2R_L} + \frac{1}{2R_H} \right) + \tag{7}$$
$$(M-1) \left[ \frac{N}{2} V_{SWL}^2 \left( \frac{1}{2R_L} + \frac{1}{2R_H} \right) + \frac{N}{2} (V_{SWL} - V_{SBL})^2 \left( \frac{1}{2R_L} + \frac{1}{2R_H} \right) \right].$$

During the RESET operation, 3N/4 of the cells of the target word line are in the LRS (due to previous SET phase), and thus the RESET operation power (PSBR-RST) of the SET-before-RESET without prior read scheme is expressed by Equation 8:

$$P_{SBR-RST} = \frac{N}{4} P_{RST} + \frac{N}{4} \frac{V_{RST}^2}{R_H} + \frac{N}{2} V_{RBL}^2 \frac{1}{R_L} + \tag{8}$$
$$(M-1) \left[ \frac{N}{2} (V_{RST} - V_{RWL})^2 \left( \frac{1}{2R_L} + \frac{1}{2R_H} \right) + \right.$$
$$\left. \frac{N}{2} (V_{RBL} - V_{RWL})^2 \left( \frac{1}{2R_L} + \frac{1}{2R_H} \right) \right],$$

and thus, the total power $P_{SBR}$ of the SET-before-RESET without prior read scheme is expressed by Equation 9:

$$P_{SBR} = P_{SBR-SET} + P_{SBR-RST} \tag{9}.$$

The power consumption $P_{SBR}$ the SET-before-RESET without prior read scheme is equal to, or higher than, the power consumption $P_{RBS}$ of the RESET-before-SET without prior read scheme, depending on the exact voltage configuration (i.e., the values of the set voltage VSET, the reset voltage VRST, and the voltages VSBL, VSWL, VRBL and VRWL.)

3) RESET-Before-SET with Prior Read

The RESET-before-SET with prior read scheme includes a read operation of reading the resistance states of the memory cells of the target word line, prior to performing RESET and SET operations with respect to the target word line to write the desired write data to the memory cells of the target word line.

For the RESET operation, Due to the above-referenced prior read operation, the locations of HRS cells in the target WL are known. Out of N/2 memory cells of the target WL that need to have the HRS in accordance with the data being written, half are already in the HRS. Thus the RESET operation may be executed on only the remaining N/4 cells which need to have the HRS and are not already in the HRS at the beginning of the RESET operation. The unselected cells on target word line include N/2 memory cells in the HRS and N/4 memory cells in the LRS, and the voltage VRBL is applied to the BLs of the unselected cells of the target word line. With respect to the memory cells of the unselected WLs, N/4 cells of each unselected word line are biased with the voltage VRST-VRWL, 3N/4 cells of each unselected word line are biased with the voltage VRBL-VRWL, and the states of the memory cells of each unselected word line are evenly split between the LRS and the HRS. Thus, the power (PRD-RBS-RST) of the RESET operation of the RESET-before-SET with prior read scheme is expressed by Equation 10:

$$P_{RD-RBS-RST} = \frac{N}{4}P_{RST} + \frac{3N}{4}V_{RBL}^2\left(\frac{1}{3R_L} + \frac{2}{3R_H}\right) + \quad (10)$$
$$(M-1)\left[\frac{N}{4}(V_{RST}-V_{RWL})^2\left(\frac{1}{2R_L} + \frac{1}{2R_H}\right) + \right.$$
$$\left.\frac{3N}{4}(V_{RBL}-V_{RWL})^2\left(\frac{1}{2R_L} + \frac{1}{2R_H}\right)\right].$$

Similarly, for the SET operation, which is performed after the above-referenced RESET operation, the locations of the LRS cells among the memory cells of the target word line are known prior to SET operation. Further, N/4 memory cells, from among the N/2 memory cells that need to have the LRS in accordance with the data being written, are already in the LRS prior to the SET operation. The rest of that memory cells of the target word line are in the HRS due to previous RESET phase. Accordingly, the power ($P_{RD-RBS-SET}$) of the SET operation of the RESET-before-SET with prior read scheme is expressed by Equation 11:

$$P_{RD-RBS-SET} = \frac{N}{4}P_{SET} + \frac{3N}{4}(V_{SET}-V_{SBL})^2\left(\frac{1}{3R_L} + \frac{2}{3R_H}\right) + \quad (11)$$
$$(M-1)\left[\frac{N}{4}V_{SWL}^2\left(\frac{1}{2R_L} + \frac{1}{2R_H}\right) + \frac{3N}{4}(V_{SWL}-V_{SBL})^2\left(\frac{1}{2R_L} + \frac{1}{2R_H}\right)\right],$$

and thus, the total power $P_{RD-RBS}$ of the RESET-before-SET with prior read scheme is expressed by Equation 12:

$$P_{RD-RBS}=P_{RD}+P_{RD-RBS-RST}+P_{RD-RBS-SET} \quad (12).$$

4) SET-Before-RESET with Prior Read

The SET-before-RESET with prior read scheme includes a read operation of reading the resistance states of the memory cells of the target word line, prior to performing SET and RESET operations with respect to the target word line to write the desired write data to the memory cells of the target word line.

Accordingly, prior to the SET operation, the locations of the N/2 memory cells of the target WL which need to have the LRS in accordance with the write data are known. Further, prior to the SET operation, N/4 memory cells from among the N/2 memory cells of the target WL which need to have the LRS in accordance with the write data being written are already in the LRS. Thus, the power ($P_{RD-SBR-SET}$) of the SET operation of the SET-before-RESET with prior read scheme is expressed by Equation 13:

$$P_{RD-SBR-SET} = \frac{N}{4}P_{SET} + \frac{3N}{4}(V_{SET}-V_{SBL})^2\left(\frac{2}{3R_L} + \frac{1}{3R_H}\right) + \quad (13)$$
$$(M-1)\left[\frac{N}{4}V_{SWL}^2\left(\frac{1}{2R_L} + \frac{1}{2R_H}\right) + \frac{3N}{4}(V_{SWL}-V_{SBL})^2\left(\frac{1}{2R_L} + \frac{1}{2R_H}\right)\right].$$

Accordingly, prior to the RESET operation, the locations of the N/2 memory cells of the target WL which need to have the HRS in accordance with the write data are known. Further, prior to the RESET operation, N/4 memory cells from among the N/2 memory cells of the target WL which need to have the HRS in accordance with the write data being written are already in the HRS. Thus, the power ($P_{RD-SBR-RST}$) of the RESET operation of the SET-before-RESET with prior read scheme is expressed by Equation 14:

$$P_{RD-SBR-RST} = \frac{N}{4}P_{RST} + \frac{3N}{4}V_{RBL}^2\left(\frac{2}{3R_L} + \frac{1}{3R_H}\right) + \quad (14)$$
$$(M-1)\left[\frac{N}{4}(V_{RST}-V_{RWL})^2\left(\frac{1}{2R_L} + \frac{1}{2R_H}\right) + \right.$$
$$\left.\frac{3N}{4}(V_{RBL}-V_{RWL})^2\left(\frac{1}{2R_L} + \frac{1}{2R_H}\right)\right],$$

and thus, the total power ($P_{RD-SBR}$) of the SET-before-RESET with prior read scheme is expressed by Equation 15:

$$P_{RD-SBR}=P_{RD}+P_{RD-SBS-SET}+P_{RD-SBR-RST} \quad (15).$$

The contribution of the prior read operation to a reduction in power of the write schemes that include the prior read operation relative to the write schemes that omit the prior read operation depends on the difference between an amount of power savings corresponding to the unselected cells and the power required for the prior read operation.

An analysis of various block and sub-block write schemes will now be provided below in section IV.

IV. Analysis of Block and Sub-Block Write Schemes

Below, write operation power consumption is analyzed with respect to five different block and sub-block write schemes: Block-erase-and-SET without prior read; Block-erase-and-SET with prior read; Sub-Block-RESET-and-SET without prior read; Sub-Block-RESET-and-SET with prior read; and Sub-Block-Erase-and-SET.

According to at least some example embodiments of the inventive concepts, a sub-block may refer to a group of word-lines including more than 1 word line and less than M word lines. Further, as is noted in Table 1, M is the number of rows (or word lines) in a block.

When handling a selected group of word lines together for the purpose of performing a write operation, it is possible to perform an RESET operation on all memory cells in the selected group of word lines, thus switching the memory cells to the HRS. If a SET operation is performed, afterwards, on a word line from among the selected group of word lines, an amount of dissipated power may be because most of the unselected memory cells are in the HRS due to the previous RESET operation performed on the selected group of word lines, thus reducing the effect of the higher power consumption associated with unselected memory cells that are in the LRS.

1) Block-Erase-and-SET without Prior Read

The Block-Erase-and-Set without prior read scheme includes erasing an entire block, bit line by bit line, sequentially, before performing a SET operation, on each word line of the block, sequentially, to selectively set certain memory cells of each word line to the LRS in accordance with the desired write data being written into the memory cells of the block.

For example, when erasing a whole block, the PRAM device 2000 may perform a bit line-wise erase operation which includes performing a RESET operation on each bit line, sequentially, by, for each bit line, powering the selected bit line with the reset voltage VRST and grounding (i.e., applying 0V to) all word lines and unselected bit lines of the block. Unselected memory cells would have substantially 0 voltage drop across them and would not consume power in bit line-wise erase operation. Alternatively, according to at least some example embodiments of the inventive concepts, instead of performing the bit line-wise erase operation by performing a RESET operation on each bit line, sequentially, the PRAM device 2000 may perform the bit line-wise erase operation by performing the a RESET operation on all bit lines, concurrently. For example, the PRAM device 2000 may perform a bit line-wise erase operation by powering all bit lines with the reset voltage VRST, while grounding all the word lines of the block at the same time, thus resetting all memory cells of the block at substantially the same time.

The power ($P_{ERS-RST}$) of the erase operation of the Block-Erase-and-Set without prior read scheme is expressed by Equation 16:

$$P_{ERS-RST} = \sum_N \frac{M}{2} P_{RST} + \frac{M}{2} \frac{V_{RST}^2}{R_H} \qquad (16)$$

$$= \frac{MN}{2} \left( P_{RST} + \frac{V_{RST}^2}{R_H} \right).$$

As is noted above, after the RESET operation, the subsequent SET operation, includes is setting cells to the LRS in row-by-row manner. Thus, the fraction of unselected cells that are in the LRS grows gradually from zero, when the SET operations is performed with respect to the first word line, upwards, the SET operation is performed with respect to more word lines. The power ($P_{W1}$) of the SET operation with respect to a first word line of the block being written to is expressed by Equation 17:

$$P_{W1} = \qquad (17)$$

$$\frac{N}{2} P_{SET} + \frac{N}{2} \frac{(V_{SET} - V_{SBL})^2}{R_H} + (M-1) \frac{N}{2} \left[ \frac{V_{SWL}^2}{R_H} + \frac{(V_{SWL} - V_{SBL})^2}{R_H} \right].$$

The power (PW2) of the SET operation with respect to a second word line of the block being written to is expressed by Equation 18:

$$P_{W2} = \frac{N}{2} P_{SET} + \frac{N}{2} \frac{(V_{SET} - V_{SBL})^2}{R_H} + \qquad (18)$$

$$(M-2) \frac{N}{2} \left[ \frac{V_{SWL}^2}{R_H} + \frac{(V_{SWL} - V_{SBL})^2}{R_H} \right] +$$

$$\frac{N}{2} [V_{SWL}^2 + (V_{SWL} - V_{SBL})^2] \left( \frac{1}{2R_L} + \frac{1}{2R_H} \right).$$

The power (PW3) of the SET operation with respect to a third word line of the block being written to is expressed by Equation 19:

$$P_{W3} = \frac{N}{2} P_{SET} + \frac{N}{2} \frac{(V_{SET} - V_{SBL})^2}{R_H} + \qquad (19)$$

$$(M-3) \frac{N}{2} \left[ \frac{V_{SWL}^2}{R_H} + \frac{(V_{SWL} - V_{SBL})^2}{R_H} \right] +$$

$$2 \cdot \frac{N}{2} [V_{SWL}^2 + (V_{SWL} - V_{SBL})^2] \left( \frac{1}{2R_L} \bigg| + \frac{1}{2R_H} \right).$$

The power ($P_{WM}$) of the SET operation with respect to a last (i.e., $M^{th}$) word line of the block being written to is expressed by Equation 20:

$$P_{WM} = \frac{N}{2} P_{SET} + \frac{N}{2} \frac{(V_{SET} - V_{SBL})^2}{R_H} + \qquad (20)$$

$$(M-1) \cdot \frac{N}{2} [V_{SWL}^2 + (V_{SWL} - V_{SBL})^2] \left( \frac{1}{2R_L} + \frac{1}{2R_H} \right).$$

The power $P_{Wi}$ of a SET operation performed on a word line i out of M, given that the previous (i−1) word lines have already been written, may be expressed by Equation 21:

$$P_{Wi} = \frac{N}{2} P_{SET} + \frac{N}{2} \frac{(V_{SET} - V_{SBL})^2}{R_H} + \qquad (21)$$

$$(M-i) \frac{N}{2} \left[ \frac{V_{SWL}^2}{R_H} + \frac{(V_{SWL} - V_{SBL})^2}{R_H} \right] +$$

$$(i-1) \cdot \frac{N}{2} [V_{SWL}^2 + (V_{SWL} - V_{SBL})^2] \left( \frac{1}{2R_L} + \frac{1}{2R_H} \right).$$

Thus, by accumulating the SET power of all word lines in the block, the overall power of performing row-by-row SET operations on all rows in the block, after the block had been erased is expressed by Equation 22:

$$P_{ERS-SET} = \sum_{i=1}^{M} P_{Wi} \qquad (22)$$

$$= \frac{MN}{2} \left[ P_{SET} + \frac{(V_{SET} - V_{SBL})^2}{R_H} \right] +$$

$$\frac{N}{2} \left[ \frac{V_{SWL}^2}{R_H} + \frac{(V_{SWL} - V_{SBL})^2}{R_H} \right] \sum_{i=1}^{M} (M-i) +$$

$$\frac{N}{2} [V_{SWL}^2 + (V_{SWL} - V_{SBL})^2]$$

-continued $$\left(\frac{1}{2R_L} + \frac{1}{2R_H}\right)\sum_{i=1}^{M}(i-1)$$

$$= \frac{MN}{2}\left[P_{SET} + \frac{(V_{SET} - V_{SBL})^2}{R_H}\right] +$$

$$\frac{M(M-1)}{2}\frac{N}{2}\left[\frac{V_{SWL}^2}{R_H} + \frac{(V_{SWL} - V_{SBL})^2}{R_H}\right] +$$

$$\frac{M(M-1)}{2}\frac{N}{2}[V_{SWL}^2 + (V_{SWL} - V_{SBL})^2]$$

$$\left(\frac{1}{2R_L} + \frac{1}{2R_H}\right)$$

$$= \frac{MN}{2}\left[P_{SET} + \frac{(V_{SET} - V_{SBL})^2}{R_H}\right] +$$

$$\frac{M(M-1)}{2}\frac{N}{2}[V_{SWL}^2 + (V_{SWL} - V_{SBL})^2]$$

$$\left(\frac{1}{2R_L} + \frac{3}{2R_H}\right).$$

Thus, the total power ($P_{ERS}$) of the Block-Erase-and-SET without prior read scheme may be expressed by Equation 23:

$$P_{ERS} = P_{ERS\text{-}RST} + P_{ERS\text{-}SET} \tag{23}$$

and the normalized power ($P_{ERS\text{-}WL}$), per word line, of the Block-Erase-and-SET without prior read scheme may be expressed by Equation 24:

$$P_{ERS-WL} = \frac{1}{M} P_{ERS}. \tag{24}$$

2) Block-Erase-and-SET with Prior Read

The Block-Erase-and-SET with prior read scheme includes a prior read operation in addition to the operations discussed above with respect to the Block-Erase-and-SET without prior read scheme. However, since whole block is erased bit-line-wise, adding a prior read operation does not provide the Block-Erase-and-SET with prior read scheme with any additional reduction in power in comparison to the Block-Erase-and-SET without prior read scheme. Thus, the total power ($P_{RD\text{-}ERS}$) of the Block-Erase-and-SET with prior read scheme may be expressed by Equation 25:

$$P_{RD\text{-}ERS} = M \cdot P_{RD} + P_{ERS} \tag{25}$$

the total power of the Block-Erase-and-SET without prior read scheme, $P_{ERS}$, being defined above by Equation 23.

3) Sub-Block-RESET-and-SET without Prior Read

Since, in at least some situations, blocks with only some invalid pages may occur in the memory cell array 2100 more frequently the blocks with all invalid pages, it may be advantageous to develop a write scheme that does not require erasing valid pages or postponing write operation until a block with all invalid pages occurs. Thus, according to at least some example embodiments of the inventive concepts, the PRAM device 2000 may perform write operations on PRAM cells of the memory cell array 2100 in a sub-block resolution. For example, when a block includes one or more valid word lines and i invalid word lines, the i word lines may be referred to, collectively, as a sub-block or target sub-block, and RESET and SET operations may be performed, specifically, on the target sub-block (i being a positive integer greater than 1 and less than M).

For example, according to at least some example embodiments of the inventive concepts, the Sub-Block-RESET-and-SET without prior read scheme includes performing a write operation by, for a selected block that has a target sub-block of i invalid word lines, executing a RESET phase of the write operation including performing a RESET operation on each of the i word lines, sequentially, and then executing a SET phase of the write operation including performing a SET operation on each of the i word lines, sequentially, to selectively set certain memory cells of each of the i word lines to the LRS in accordance with the write data being written to the target sub-block.

In the RESET phase, the power consumed by the unselected memory cells of the block gradually decreases since, for every row of memory cells of the target sub-block that is RESET to the HRS, the total number of unselected memory cells in the block that are in the higher-power-consuming LRS is reduced.

For example, with respect to the RESET operation performed on the first word line of the target sub-block, all other rows (M−1 rows) in the block may be expected to have, on average, half of their memory cells in the LRS. Therefore, the power ($P_{W1}$) of performing the RESET operation with respect to the first word line of the target sub-block in the Sub-Block-RESET-and-SET without prior read scheme may be expressed by Equation 26:

$$P_{W1} = \frac{N}{4}P_{RST} + \frac{N}{4}\frac{V_{RST}^2}{R_H} + \frac{N}{2}V_{RBL}^2\left(\frac{1}{2R_L} + \frac{1}{2R_H}\right) + \tag{26}$$

$$(M-1)\left[\frac{N}{2}(V_{RST} - V_{RWL})^2\left(\frac{1}{2R_L} + \frac{1}{2R_H}\right) + \frac{N}{2}(V_{RBL} - V_{RWL})^2\left(\frac{1}{2R_L} + \frac{1}{2R_H}\right)\right].$$

When performing the RESET operation on the second word line, ¾ of the cells of the previous word line are in the HRS, and the remaining (M−2) word lines have random data. Thus, the power ($P_{W2}$) of performing the RESET operation with respect to the second word line of the target sub-block may be expressed by Equation 27:

$$P_{W2} = \frac{N}{4}P_{RST} + \frac{N}{4}\frac{V_{RST}^2}{R_H} + \frac{N}{2}V_{RBL}^2\left(\frac{1}{2R_L} + \frac{1}{2R_H}\right) + \tag{27}$$

$$\left(\frac{1}{4R_L} + \frac{3}{4R_H}\right)\left[\frac{N}{2}(V_{RST} - V_{RWL})^2 + \frac{N}{2}(V_{RBL} - V_{RWL})^2\right] +$$

$$(M-2)\left[\frac{N}{2}(V_{RST} - V_{RWL})^2\left(\frac{1}{2R_L} + \frac{1}{2R_H}\right) + \frac{N}{2}(V_{RBL} - V_{RWL})^2\left(\frac{1}{2R_L} + \frac{1}{2R_H}\right)\right],$$

and the power ($P_{W3}$) of performing the RESET operation with respect to the third word line of the target sub-block may be expressed by Equation 28:

$$P_{W3} = \frac{N}{4}P_{RST} + \frac{N}{4}\frac{V_{RST}^2}{R_H} + \frac{N}{2}V_{RBL}^2\left(\frac{1}{2R_L} + \frac{1}{2R_H}\right) + \tag{28}$$

$$2\left(\frac{1}{4R_L} + \frac{3}{4R_H}\right)\left[\frac{N}{2}(V_{RST} - V_{RWL})^2 + \frac{N}{2}(V_{RBL} - V_{RWL})^2\right] +$$

$$(M-3)\left[\frac{N}{2}(V_{RST} - V_{RWL})^2\left(\frac{1}{2R_L} + \frac{1}{2R_H}\right) + \frac{N}{2}(V_{RBL} - V_{RWL})^2\left(\frac{1}{2R_L} + \frac{1}{2R_H}\right)\right].$$

The power ($P_{Wi}$) of performing the RESET operation with respect to the last (i.e., $i^{th}$) word line may be expressed by Equation 29:

$$P_{Wi} = \frac{N}{4}P_{RST} + \frac{N}{4}\frac{V_{RST}^2}{R_H} + \frac{N}{2}V_{RBL}^2\left(\frac{1}{2R_L} + \frac{1}{2R_H}\right) + \qquad (29)$$
$$(i-1)\left(\frac{1}{4R_L} + \frac{3}{4R_H}\right)\left[\frac{N}{2}(V_{RST} - V_{RWL})^2 + \frac{N}{2}(V_{RBL} - V_{RWL})^2\right] +$$
$$(M-i)\left[\frac{N}{2}(V_{RST} - V_{RWL})^2\left(\frac{1}{2R_L} + \frac{1}{2R_H}\right) + \right.$$
$$\left.\frac{N}{2}(V_{RBL} - V_{RWL})^2\left(\frac{1}{2R_L} + \frac{1}{2R_H}\right)\right].$$

Thus, the total power ($P_{SUB-RST}$) of the PRAM device 2000 executing the RESET phase by performing i RESET operations on the i rows of the target sub-block (out of the M rows of the block) is expressed by Equation 30:

$$P_{SUB-RST} = \sum_{j=1}^{i} P_{Wj} \qquad (30)$$
$$= i\left[\frac{N}{4}P_{RST} + \frac{N}{4}\frac{V_{RST}^2}{R_H} + \frac{N}{2}V_{RBL}^2\left(\frac{1}{2R_L} + \frac{1}{2R_H}\right)\right] +$$
$$\sum_{j=1}^{i-1}\left(\frac{1}{4R_L} + \frac{3}{4R_H}\right)\left[\frac{N}{2}(V_{RST} - V_{RWL})^2 + \frac{N}{2}(V_{RBL} - V_{RWL})^2\right] +$$
$$\sum_{j=1}^{i}(M-j)\left[\frac{N}{2}(V_{RST} - V_{RWL})^2\left(\frac{1}{2R_L} + \frac{1}{2R_H}\right) + \frac{N}{2}(V_{RBL} - V_{RWL})^2\left(\frac{1}{2R_L} + \frac{1}{2R_H}\right)\right]$$
$$= i\left[\frac{N}{4}P_{RST} + \frac{N}{4}\frac{V_{RST}^2}{R_H} + \frac{N}{2}V_{RBL}^2\left(\frac{1}{2R_L} + \frac{1}{2R_H}\right)\right] +$$
$$\frac{i(i-1)}{2}\left(\frac{1}{4R_L} + \frac{3}{4R_H}\right)\left[\frac{N}{2}(V_{RST} - V_{RWL})^2 + \frac{N}{2}(V_{RBL} - V_{RWL})^2\right] +$$
$$\frac{i(2M-i-1)}{2}\left[\frac{N}{2}(V_{RST} - V_{RWL})^2\left(\frac{1}{2R_L} + \frac{1}{2R_H}\right) + \frac{N}{2}(V_{RBL} - V_{RWL})^2\left(\frac{1}{2R_L} + \frac{1}{2R_H}\right)\right].$$

After the above-referenced RESET phase is executed on the target sub-block, the SET phase is executed on the target sub-block by performing i SET operations on the i word lines of the target sub-block, sequentially. During the SET phase, the power consumption associated with the unselected memory cells gradually increases as more of the i word lines are written, due to a gradual increase in a total number of unselected cells that are in the LRS. When the SET operation is performed with respect to the first word line from among the i word lines of the target sub-block, ¾ of the memory cells in each of the (i−1) word lines of the target sub-block are in the HRS, and the memory cells of (M−i) rows of the block store random data (i.e., data corresponding to memory cells having resistivity states that are substantially evenly distributed among the HRS and the LRS). Thus, the power ($P_{W1}$) of performing the SET operation with respect to the first word line of the target sub-block in the Sub-Block-RESET-and-SET without prior read scheme may be expressed by Equation 31:

$$P_{W1} = \frac{N}{4}P_{SET} + \frac{N}{4}\frac{V_{SET}^2}{R_L} + \frac{N}{2}(V_{SET} - V_{SBL})^2\frac{1}{R_H} + \qquad (31)$$
$$(i-1)\left(\frac{1}{4R_L} + \frac{3}{4R_H}\right)\left[\frac{N}{2}V_{SWL}^2 + \frac{N}{2}(V_{SWL} - V_{SBL})^2\right] +$$
$$(M-i)\left[\frac{N}{2}V_{SWL}^2\left(\frac{1}{2R_L} + \frac{1}{2R_H}\right) + \frac{N}{2}(V_{SWL} - V_{SBL})^2\left(\frac{1}{2R_L} + \frac{1}{2R_H}\right)\right].$$

Further, the power ($P_{W2}$) of performing the SET operation with respect to the second word line of the target sub-block in the Sub-Block-RESET-and-SET without prior read scheme may be expressed by Equation 32:

$$P_{W2} = \frac{N}{4}P_{SET} + \frac{N}{4}\frac{V_{SET}^2}{R_L} + \frac{N}{2}(V_{SET} - V_{SBL})^2\frac{1}{R_{H|}} + \qquad (32)$$
$$(i-2)\left(\frac{1}{4R_L} + \frac{3}{4R_H}\right)\left[\frac{N}{2}V_{SWL}^2 + \frac{N}{2}(V_{SWL} - V_{SBL})^2\right] +$$
$$(M-i+1)\left[\frac{N}{2}V_{SWL}^2\left(\frac{1}{2R_L} + \frac{1}{2R_H}\right) + \right.$$
$$\left.\frac{N}{2}(V_{SWL} - V_{SBL})^2\left(\frac{1}{2R_L} + \frac{1}{2R_H}\right)\right].$$

When performing the SET operation with respect to the last (i.e., $i^{th}$) row, all other (M−1) rows are with random data (i.e., data corresponding to an even distribution between the LRS and HRS states), and the power ($P_{Wi}$) of the SET operation with respect to the last row may be equivalent to the power of performing a SET operation on a single word line in a random data block, and may be expressed as Equation 33:

$$P_{Wi} = \frac{N}{4}P_{SET} + \frac{N}{4}\frac{V_{SET}^2}{R_L} + \frac{N}{2}(V_{SET} - V_{SBL})^2\frac{1}{R_H} + \qquad (33)$$
$$(M-i+i-1)\left[\frac{N}{2}V_{SWL}^2\left(\frac{1}{2R_L} + \frac{1}{2R_H}\right) + \right.$$
$$\left.\frac{N}{2}(V_{SWL} - V_{SBL})^2\left(\frac{1}{2R_L} + \frac{1}{2R_H}\right)\right].$$

Thus, the total power ($P_{SUB-SET}$) of the PRAM device 2000 executing the SET phase by performing i SET operation on the i rows of the target sub-block (out of the M rows of the block) is expressed by Equation 34:

$$P_{SUB-SET} = \sum_{j=1}^{i} P_{Wj} \qquad (34)$$
$$= i\left[\frac{N}{4}P_{SET} + \frac{N}{4}\frac{V_{SET}^2}{R_L} + \frac{N}{2}(V_{SET} - V_{SBL})^2\frac{1}{R_H}\right] +$$
$$\sum_{j=0}^{i-1}\left(\frac{1}{4R_L} + \frac{3}{4R_H}\right)\left[\frac{N}{2}V_{SWL}^2 + \frac{N}{2}(V_{SWL} - V_{SBL})^2\right] +$$
$$\sum_{j=M-i}^{M-1}\left[\frac{N}{2}V_{SWL}^2\left(\frac{1}{2R_L} + \frac{1}{2R_H}\right) + \right.$$
$$\left.\frac{N}{2}(V_{SWL} - V_{SBL})^2\left(\frac{1}{2R_L} + \frac{1}{2R_H}\right)\right],$$

and thus, the total power ($P_{SUB-RST\&SET}$) of the PRAM device 2000 performing a write operation in accordance with the Sub-Block-RESET-and-SET without prior read scheme may be expressed by Equation 35:

$$P_{SUB-RST\&SET} = P_{SUB-RST} + P_{SUB-SET} \quad (35).$$

4) Sub-Block-RESET-and-SET with Prior Read

The present scheme results from adding a prior read operation to the above-referenced Sub-Block-RESET-and-SET without prior read scheme. According to at least some example embodiments of the inventive concepts, adding the prior read operation may result in a reduction in power consumption during the RESET phase, and not during the SET phase. According to at least some example embodiments of the inventive concepts, the PRAM 2000 may perform the RESET phase of the Sub-Block-RESET-and-SET with prior read scheme only with respect to memory cells that are currently in the LRS (as revealed by the prior read operation) and need to be changed to the HRS in accordance with the write data being written to the target sub-block. Consequently, the RESET phase of the Sub-Block-RESET-and-SET with prior read scheme may exclude performing a RESET operation with respect to memory cells of target word lines that do not need to have their resistivity states changed from the LRS to the HRS, due to the resistivity states already being in the HRS, as revealed by the prior read operation.

Thus, as is shown by Equation 36, below, the power ($P_{W1}$) of the RESET operation of the present Sub-Block-RESET-and-SET with prior read scheme with respect to a first word line of the target sub-block is equivalent to the power ($P_{RD-RBS-RST}$) of the single-word line, RESET-before-SET scheme described above with reference to Equation 12.

$$P_{W1} = P_{RD-RBS-RST} \quad (36).$$

When performing the RESET operation with respect to a second row of the target sub-block, there is a single row in the block with ¾ HRS cells and (M−2) rows in the block with random data. Thus, the power ($P_{W2}$) of the RESET operation of the present Sub-Block-RESET-and-SET with prior read scheme with respect to the second word line of the target sub-block may be expressed by Equation 37:

$$P_{W2} = \frac{N}{4} P_{RST} + \frac{3N}{4} V_{RBL}^2 \left( \frac{1}{3R_L} + \frac{2}{3R_H} \right) + \quad (37)$$
$$\left( \frac{1}{4R_L} + \frac{3}{4R_H} \right) \left[ \frac{N}{4} (V_{RST} - V_{RWL})^2 + \frac{3N}{4} (V_{RBL} - V_{RWL})^2 \right] +$$
$$(M-2) \left[ \frac{N}{4} (V_{RST} - |V_{RWL}|)^2 \left( \frac{1}{2R_L} + \frac{1}{2R_H} \right) + \right.$$
$$\left. \frac{3N}{4} (V_{RBL} - V_{RWL})^2 \left( \frac{1}{2R_L} + \frac{1}{2R_H} \right) \right].$$

Further, the power ($P_{W3}$) of the RESET operation of the present Sub-Block-RESET-and-SET with prior read scheme with respect to a third word line of the target sub-block may be expressed by Equation 38:

$$P_{W3} = \frac{N}{4} P_{RST} + \frac{3N}{4} V_{RBL}^2 \left( \frac{1}{3R_L} + \frac{2}{3R_H} \right) + \quad (38)$$
$$2 \left( \frac{1}{4R_L} + \frac{3}{4R_H} \right) \left[ \frac{N}{4} (V_{RST} - V_{RWL})^2 + \frac{3N}{4} (V_{RBL} - V_{RWL})^2 \right] +$$
$$(M-3) \left[ \frac{N}{4} (V_{RST} - V_{RWL})^2 \left( \frac{1}{2R_L} + \frac{1}{2R_H} \right) + \right.$$
$$\left. \frac{3N}{4} (V_{RBL} - V_{RWL})^2 \left( \frac{1}{2R_L} + \frac{1}{2R_H} \right) \right].$$

When performing the RESET operation with respect to the last (i.e., $i^{th}$) word line of the target sub-block, ¾ of the memory cells in each of (i−1) rows of the M rows of the selected block are in the HRS. Thus, the power ($P_{Wi}$) of the RESET operation of the present Sub-Block-RESET-and-SET with prior read scheme with respect to the $i^{th}$ word line of the target sub-block may be expressed by Equation 39:

$$P_{Wi} = \frac{N}{4} P_{RST} + \frac{3N}{4} V_{RBL}^2 \left( \frac{1}{3R_L} + \frac{2}{3R_H} \right) + \quad (39)$$
$$(i-1) \left( \frac{1}{4R_L} + \frac{3}{4R_H} \right) \left[ \frac{N}{4} (V_{RST} - V_{RWL})^2 + \frac{3N}{4} (V_{RBL} - V_{RWL})^2 \right] +$$
$$(M-i) \left[ \frac{N}{4} \left| (V_{RST} - V_{RWL})^2 \left( \frac{1}{2R_L} + \frac{1}{2R_H} \right) + \right.\right.$$
$$\left.\left. \frac{3N}{4} (V_{RBL} - V_{RWL})^2 \left( \frac{1}{2R_L} + \frac{1}{2R_H} \right) \right].$$

Thus, the total power ($P_{RD-SUB-RST}$) of the PRAM 2000 executing the RESET phase by performing i RESET operations on the i rows of the target sub-block (out of the M rows of the block) in the Sub-Block-RESET-and-SET with prior read scheme is expressed by Equation 40:

$$P_{RD-SUB-RST} = \sum_{j=1}^{i} P_{Wj} \quad (40)$$
$$= i \left[ \frac{N}{4} P_{RST} + \frac{3N}{4} V_{RBL}^2 \left( \frac{1}{3R_L} + \frac{2}{3R_H} \right) \right] +$$
$$\sum_{j=0}^{i-1} \left( \frac{1}{4R_L} + \frac{3}{4R_H} \right) \left[ \frac{N}{4} (V_{RST} - V_{RWL})^2 + \right.$$
$$\left. \frac{3N}{4} (V_{RBL} - V_{RWL})^2 \right] +$$
$$\sum_{j=M-i}^{M-1} \left[ \frac{N}{4} (V_{iRST} - V_{RWL})^2 \left( \frac{1}{2R_L} + \frac{1}{2R_H} \right) + \right.$$
$$\left. \frac{3N}{4} (V_{RBL} - V_{RWL})^2 \left( \frac{1}{2R_L} + \frac{1}{2R_H} \right) \right]$$
$$= i \left[ \frac{N}{4} P_{RST} + \frac{3N}{4} V_{RBL}^2 \left( \frac{1}{3R_L} + \frac{2}{3R_H} \right) \right] +$$
$$\frac{i(i-1)}{2} \left( \frac{1}{4R_L} + \frac{3}{4R_H} \right) \left[ \frac{N}{4} (V_{RST} - V_{RWL})^2 + \right.$$
$$\left. \frac{3N}{4} (V_{RBL} - V_{RWL})^2 \right] +$$
$$\frac{i(2M-i-1)}{2} \left[ \frac{N}{4} (V_{RST} - V_{RWL})^2 \left( \frac{1}{2R_L} + \frac{1}{2R_H} \right) + \right.$$
$$\left. \frac{3N}{4} (V_{RBL} - V_{RWL})^2 \left( \frac{1}{2R_L} + \frac{1}{2R_H} \right) \right].$$

With respect to the SET phase of the Sub-Block-RESET-and-SET with prior read scheme, according to at least some example embodiments of the inventive concepts, no prior read operation is performed. Thus, as is shown below by Equation 41, the total power ($P_{RD-SUB-SET}$) of the PRAM device 2000 executing the SET phase of the Sub-Block-RESET-and-SET with prior read scheme is equivalent to the power ($P_{SUB-SET}$) of the PRAM device 2000 executing SET phase of the Sub-Block-RESET-and-SET without prior read scheme described above with respect to Equation 34.

$$P_{RD-SUB-SET} = P_{SUB-SET} \tag{41}$$

Thus, the overall power consumption ($P_{RD-SUB-R\&S}$) of PRAM device 2000 performing the Sub-Block-RESET-and-SET with prior read scheme may be expressed by Equation 42:

$$P_{RD-SUB-R\&S} = i \cdot P_{RD} + P_{RD-SUB-RST} + P_{RD-SUB-SET} \tag{42}$$

5) Sub-Block-Erase-and-SET

In the Sub-Block-Erase-and-SET scheme, the memory controller 1000 may control the PRAM device 2000 such that all i invalid pages of the target sub-block are erased during a RESET phase of the Sub-Block-Erase-and-SET scheme, and then all i invalid pages are written, sequentially, during a SET phase of the Sub-Block-Erase-and-SET scheme.

The RESET phase of the Sub-Block-Erase-and-SET scheme may include performing i word line-wise erase operations on the i word lines of the target sub-block, sequentially, where each erase operation includes resetting each memory cell in the word line to a HRS. With respect to the RESET phase, the power ($P_{W1}$) of performing an erase operation on a first word line of the target sub-block may be expressed by Equation 43:

$$P_{W1} = \frac{N}{2} \cdot P_{RST} + \frac{N}{2} \frac{V_{RST}^2}{R_H} + (M-1)\left[\frac{N}{2}(V_{RST} - V_{RWL})^2 \left(\frac{1}{R_L} + \frac{1}{R_H}\right)\right], \tag{43}$$

the power ($P_{W2}$) of performing an erase operation on a second word line of the target sub-block may be expressed by Equation 44:

$$P_{W2} = \frac{N}{2} \cdot P_{RST} + \frac{N}{2} \frac{V_{RST}^2}{R_H} + \frac{N}{R_H}(V_{RST} - V_{RWL})^2 + \tag{44}$$
$$(M-2)\left[\frac{N}{2}(V_{RST} - V_{RWL})^2 \left(\frac{1}{R_L} + \frac{1}{R_H}\right)\right],$$

the power ($P_{W3}$) of performing an erase operation on a third word line of the target sub-block may be expressed by Equation 45:

$$P_{W3} = \frac{N}{2} \cdot P_{RST} + \frac{N}{2} \frac{V_{RST}^2}{R_H} + 2\frac{N}{R_H}(V_{RST} - V_{RWL})^2 + \tag{45}$$
$$(M-3)\left[\frac{N}{2}(V_{RST} - V_{RWL})^2 \left(\frac{1}{R_L} + \frac{1}{R_H}\right)\right],$$

the power ($P_{Wi}$) of performing an erase operation on the last (i.e., $i^{th}$) word line of the target sub-block may be expressed by Equation 46:

$$P_{Wi} = \frac{N}{2} \cdot P_{RST} + \frac{N}{2} \frac{V_{RST}^2}{R_H} + (i-1)\frac{N}{R_H}(V_{RST} - V_{RWL})^2 + \tag{46}$$
$$(M-i)\left[\frac{N}{2}(V_{RST} - V_{RWL})^2 \left(\frac{1}{R_L} + \frac{1}{R_H}\right)\right],$$

and the total power ($P_{SUB-ERS}$) of the PRAM 2000 executing the RESET phase of the Sub-Block-Erase-and-SET scheme may be expressed by Equation 47:

$$P_{SUB-ERS} = \sum_{j=1}^{i} P_{Wj} \tag{47}$$
$$= i\frac{N}{2}\left[P_{RST} + \frac{V_{RST}^2}{R_H}\right] +$$
$$\sum_{j=1}^{i-1} \frac{N}{R_H}(V_{RST} - V_{RWL})^2 +$$
$$\sum_{j=1}^{i}(M-j)\left[\frac{N}{2}(V_{RST} - V_{RWL})^2 \left(\frac{1}{2R_L} + \frac{1}{2R_H}\right)\right]$$
$$= i\frac{N}{2}\left[P_{RST} + \frac{V_{RST}^2}{R_H}\right] +$$
$$\frac{i(i-1)}{2}\frac{N}{R_H}(V_{RST} - V_{RWL})^2 +$$
$$\frac{i(2M-i-1)}{2}\left[\frac{N}{2}(V_{RST} - V_{RWL})^2 \left(\frac{1}{2R_L} + \frac{1}{2R_H}\right)\right].$$

During the SET phase of the Sub-Block-Erase-and-SET scheme, certain memory cells from among the i word lines of the target sub-block are set to the LRS in accordance with the write data being written to the target sub-block by performing a SET operation on each of the i word lines, sequentially.

Thus, the power ($P_{W1}$) of performing a SET operation on a first word line of the target sub-block may be expressed by Equation 48:

$$P_{W1} = \frac{N}{2}P_{SET} + (i-1)\frac{1}{R_H}\left[\frac{N}{2}V_{SWL}^2 + \frac{N}{2}(V_{SWL} - V_{SBL})^2\right] + \tag{48}$$
$$(M-i)\left(\frac{1}{2R_L} + \frac{1}{2R_H}\right)\left[\frac{N}{2}V_{SWL}^2 + \frac{N}{2}(V_{SWL} - V_{SBL})^2\right],$$

the power ($P_{W2}$) of performing a SET operation on a second word line of the target sub-block may be expressed by Equation 49:

$$P_{W2} = \frac{N}{2}P_{SET} + (i-2)\frac{1}{R_H}\left[\frac{N}{2}V_{SWL}^2 + \frac{N}{2}(V_{SWL} - V_{SBL})^2\right] + \tag{49}$$
$$(M-i-1)\left(\frac{1}{2R_L} + \frac{1}{2R_H}\right)\left[\frac{N}{2}V_{SWL}^2 + \frac{N}{2}(V_{SWL} - V_{SBL})^2\right],$$

and the power ($P_{Wi}$) of performing a SET operation on the last (i.e., $i^{th}$) word line of the target sub-block may be expressed by Equation 50:

$$P_{Wi} = \frac{N}{2}P_{SET} + (M-1)\left(\frac{1}{2R_L} + \frac{1}{2R_H}\right)\left[\frac{N}{2}V_{SWL}^2 + \frac{N}{2}(V_{SWL} - V_{SBL})^2\right]. \tag{50}$$

Thus, the total power ($P_{SUB-ERS-SET}$) of the PRAM device 2000 executing the SET phase of the Sub-Block-Erase-and-SET scheme may be expressed by Equation 51:

$$P_{SUB-ERS-SET} = \sum_{j=1}^{i} P_{Wj} \tag{51}$$
$$= i\frac{N}{2}P_{SET} +$$

-continued $$\sum_{j=1}^{i}(i-j)\frac{1}{R_H}\left[\frac{N}{2}V_{SWL}^2+\frac{N}{2}(V_{SWL}-V_{SBL})^2\right]+$$

$$\sum_{j=M-i}^{M-1}\left[\left(\frac{1}{2R_L}+\frac{1}{2R_H}\right)\frac{N}{2}V_{SWL}^2+\right.$$

$$\left.\frac{N}{2}(V_{SWL}-V_{SBL})^2\right]$$

$$=i\frac{N}{2}P_{SET}+$$

$$\frac{i(i-1)}{2}\frac{1}{R_H}\left[\frac{N}{2}V_{SWL}^2+\frac{N}{2}(V_{SWL}-V_{SBL})^2\right]+$$

$$\frac{i(2M-i-1)}{2}\left[\left(\frac{1}{2R_L}+\frac{1}{2R_H}\right)\frac{N}{2}V_{SWL}^2+\right.$$

$$\left.\frac{N}{2}(V_{SWL}-V_{SBL})^2\right],$$

and the total power ($P_{SUB-ERS}$) of the PRAM device 2000 performing a write operation on the target sub-block in accordance with the Sub-Block-Erase-and-SET scheme may be expressed by Equation 52:

$$P_{SUB-ERS\&SET} = P_{SUB-ERS} + P_{SUB-ERS-SET} \qquad (52).$$

Table 2, below, examples of normalized power consumption values for the purpose of comparing the performances of above-referenced write schemes.

TABLE 2

| Scheme | Normalized Power Consumption |
| --- | --- |
| Single word line SET-before-RESET without prior read | 1.00 |
| Single word line RESET-before-SET without prior read | 0.99 |
| Single word line SET-before-RESET with prior read | 0.35 |
| Single word line RESET-before-SET with prior read | 0.34 |
| Sub-block-RESET-and-SET without prior read, i = M/2 | 0.32 |
| Sub-block-Erase-and-SET, i = M/2 | 0.31 |
| Sub-block-RESET-and-SET with prior read, i = M/2 | 0.24 |
| Block-erase-and-SET with prior read | 0.15 |
| Block-erase-and-SET without prior read | 0.14 |

In Table 2, the illustrated power consumption values are normalized such that each value is represented as a fraction of the highest power consumption value, the power consumption value of the Single word line SET-before-RESET without prior read scheme. As is illustrated in Table 2, the single word line schemes are each outperformed, in terms of power consumption efficiency, by the schemes in which an entire block is erased prior to performing SET operations on the block, and the schemes in which a sub-block is erased or selectively RESET prior to performing SET operations on the sub-block.

Example algorithms for performing write operations on PRAM cells of a PRAM device, according to at least some example embodiments of the inventive concepts, will now be discussed in section V, below.

V. Example Algorithms for Performing Write Operations on PRAM Cells of a PRAM Device Example algorithms that may be implemented by the memory system 900 (e.g., the memory controller 1000) will now be discussed with reference to Algorithms 1, 1M and 2 below. According to at least some example embodiments of the inventive concepts, Algorithm 1 selectively chooses between implementing the Block-erase-and-SET without prior read scheme and the Sub-block-erase-and-SET scheme, based on a number of invalid pages in a selected block B, Algorithm 1M is Algorithm 1 modified such that valid pages may be buffered and erased under certain circumstances, and Algorithm 2 is an example of the Sub-block-RESET-before-SET without prior read scheme.

Algorithms 1, 1M and 2, are discussed with reference to an example in which the data stored in the memory cells of a WL is referred to as a "page" or "data page." Accordingly, in the discussions of Algorithms 1, 1M and 2, below, a WL storing a valid "page" or "data page" may also be referred to as a valid WL, and a WL storing an invalid "page" or "data page" may also be referred to as an invalid WL.

Algorithm 1

Input: {i—threshold write request number, M number of rows per block}
(A1) Buffer i write requests;
(A2) Selected block B←block with most invalid pages;
(A3) If number of invalid pages in B=M:
  (A3.1) Perform bit line-wise block erase on B;
(A4) Else:
  (A4.1) Perform word line-wise sub-block erase of i invalid pages of B;
(A5) SET each erased word line of B, sequentially, in accordance with a data page included in the i buffered write requests;
(A6) return to (A1).

According to at least some example embodiments of the inventive concepts, Algorithm 1 is an algorithm for performing a write operation in a PRAM device. As is discussed in greater detail below, Algorithm 1 includes selectively choosing between performing a full block-erase operation and a sub-block-erase operation, prior to writing write data to the PRAM cells of the selected block B by performing SET operations, based on a number of invalid pages in the selected block B. According to at least some example embodiments of the inventive concepts, Algorithm 1 includes steps (A1)-(A5), each of which may be performed executed and/or controlled by, for example, the memory controller 1000. According to at least some example embodiments of the inventive concepts, Algorithm 1 may be considered to include a reset phase and a subsequent set phase. The reset phase may also be referred to as an erase phase. According to at least some example embodiments of the inventive concepts, steps (A3), (A3.1), (A4) and (A4.1) are included in the reset phase of Algorithm 1, and step (A5) is included in the set phase of Algorithm 1. As is discussed in greater detail below, in general, the memory controller 1000 may be configured such that the reset phase of the write operation described by Algorithm 1 includes erasing the PRAM cells included in first word lines from among the plurality of word lines included in a selected block, from among the plurality of blocks in the memory cell array 2100, and the set phase of the write operation described by Algorithm 1 includes, after the reset phase, writing the write data from a buffered first number of write requests to the PRAM cells of the first word lines.

Referring to Algorithm 1, in step (A1), i write requests are buffered. For example, according to at least some example embodiments of the inventive concepts, the memory controller 1000 buffers i write requests in the write buffer 150. For example, the memory controller 1000 may receive write requests from an external source such as a host. According to at least some example embodiments, each write request may include write data. For example, each write request may include a data page. Further, according to at least some example embodiments of the inventive concepts, the memory controller 1000 may proceed to step (A2) in response to determining that the number of write requests buffered in the write buffer 150 reaches i. According to at least some example embodiments of the inventive concepts, i is a positive integer greater than 1 and less than M.

In step (A2), the block with the most invalid pages (e.g., the block with the highest number of word lines identified as invalid word lines in the validity table 160) is selected as selected block B. For example, referring to FIG. 1C, the memory controller 1000 may refer to the validity table 160 and determine which block, from among the blocks of the memory cell array 2100, includes the most invalid pages. The memory controller 1000 may select the block with the most invalid pages as the selected block B. Next, the memory controller 1000 may proceed to step (A3).

In step (A3), if the number of invalid pages in selected block B is equal to a reference number (e.g., the total number of pages per block, M), step (A3.1) is performed, and step (4.1) is not performed. Otherwise, step (3.1) is not performed, it is determined that the number of invalid pages in selected block B does not equal the total number of pages per block M in step (A4), and step (A4.1) is performed.

For example, in step (A3), the controller 1000 may compare the number of invalid pages in the selected block B to the total number of pages M. If, in step (A3), the memory controller 1000 determines that the number of invalid pages in the selected block B is equal to the total number of pages per block M (i.e., all the pages in the selected block B are invalid), then the memory controller 1000 proceeds to step (A3.1). Otherwise, the memory controller 1000 proceeds to step (A4) without performing step (3.1).

In step (A3.1), a bit line-wise block erase operation is performed on the selected block B. For example, in step (A3.1), the memory controller 1000 may control the PRAM device 2000 to perform a bit line-wise block erase operation on the selected block B in order to, for example, reset the resistivity states of all the memory cells in the block B to the HRS. For example, using the second block 2130 and the sub-block 2135 of FIG. 1A as examples of the selected block B and a sub-block corresponding to the i invalid word lines, in step (A3.1), the memory controller 1000 may execute the bit line-wise erase operation by controlling the PRAM device 2000 to select each bit line separately and sequentially, and, for each selected bit line, power the selected bit line with the reset voltage VRST while grounding (i.e., applying 0V to) all word lines and unselected bit lines of the second block 2130, thereby resetting the resistivity states of all memory cells connected to the selected bit line to the HRS.

Alternatively, in step (A3.1), the memory controller 1000 may execute the bit line-wise erase operation by controlling the PRAM device 2000 to power all the bit lines with the reset voltage VRST, simultaneously, while grounding (i.e., applying 0V to) all word lines and unselected bit lines of the second block 2130, simultaneously, thereby resetting the resistivity states of all memory cells of the second block 2130 to the HRS at the same time.

Thus, as is discussed above, in step (A3), the memory controller 1000 may determine whether or not a total number of the word lines in the selected block B that are identified as invalid word lines by the validity table 160 exceeds a threshold value (e.g., (M−1)). Further, in step (A3.1), the memory controller 1000 may perform a bit line-wise block erase process on the selected block B, in response to determining that the total number of the word lines in the selected block that are identified as invalid word lines by the validity table 160 exceeds a threshold value (e.g., (M−1)).

According to at least some example embodiments of the inventive concepts, in step (A4), the memory controller 1000 determines whether the condition from step (A3) is met, and if the condition is not met (i.e., one or more of the pages in the selected block B are not invalid), the memory controller 1000 proceeds to step (A4.1). If the condition from step (A3) is met, the memory controller 1000 does not perform step (A4.1), and proceeds to step (A5).

In step (A4.1), a word line-wise block erase operation is performed on the selected block B. For example, in step (A4.1), the memory controller 1000 may control the PRAM device 2000 to perform a word line-wise sub-block erase operation on the i invalid pages of the selected block B in order to, for example, reset the resistivity states of all the memory cells in the i invalid word-lines of block B to the HRS. For example, the memory controller 1000 may select, as the i invalid word lines of the selected block B, word lines of the selected block B that are identified as invalid word lines in the validity table 160.

For example, using the second block 2130 and the sub-block 2135 of FIG. 1A as examples of the selected block B and a sub-block corresponding to the i invalid word lines, in step (A4.1), the memory controller 1000 may execute the word line-wise erase operation by controlling the PRAM device 2000 to sequentially select each one of the i invalid word lines in the sub-block 2135, one at a time, and, for each selected invalid word line, ground the selected invalid word line while applying the voltage VRWL to each of the other word lines in the second block 2130 (e.g., all of the unselected word lines in the second block 2130), and apply the reset voltage VRST to each of the bit lines (e.g., each of the N bit lines in the memory cell array 2100), thereby resetting the resistivity states of each of the memory cells in the selected invalid word line to the HRS. Accordingly, the memory controller 1000 may perform the word line-wise erase operation by controlling the PRAM device 2000 to perform a RESET operation on each one of the i invalid word lines, separately and sequentially. After step (A4.1), the memory controller 1000 proceeds to step (A5).

Thus, as is discussed above, in step (A4.1), the memory controller 1000 may perform a word line-wise erase process on only the word lines in the selected block that are identified by the validity table 160 as being invalid, in response to determining (e.g., in step A4) that the total number of the word lines in the selected block that are identified as invalid word lines by the validity table does not exceed a threshold value (e.g., (M−1)).

In step (A5), each word line of the selected block B that was erased in step (A3.1) or step (A4.1) is SET, sequentially, in accordance with a data page included in the i buffered write requests. For example, in step (A5), for each word line that was erased in step (A3.1) or step (A4.1), the memory controller 1000 may control the PRAM device 2000 to select the erased word line, apply the set voltage VSET to the selected erased word line, ground the bit lines connected to each memory cell of the selected erased word line that needs to be set to the LRS in accordance with a data page corresponding to the selected erased word line from among the data pages of the i buffered write requests, apply the voltage VSWL to each of the unselected word lines, and apply the voltage VSBL to each of the unselected bit lines, thereby selectively setting the resistivity states of memory cells from among the memory cells of the selected erased word line to the LRS. After step (A5), the memory controller 1000 proceeds to step (A6).

In step (A6), the algorithm returns to step (A1) until i new write requests are buffered. For example, in step (A6), the memory controller 1000 may return to step (A1) and buffer new received write requests in the write buffer 150 until i new write requests have been buffered.

According to at least some example embodiments of the inventive concepts, the memory controller may execute steps (A1)-(A6), iteratively, for example, until the write controller 1000 stops receiving write requests of the memory system 900 is powered down.

Algorithm 1M, which is a modified version of Algorithm 1 in which a full block-erase operation may be performed even when all of the pages in the selected block B are not invalid, according to at least some example embodiments of the inventive concepts, will now be discussed below.

Algorithm 1M
Input: {i—threshold write request number, M number of rows per block}
(A1) Buffer i write requests;
(A2) Selected block B←block with most invalid pages;
(A3) If (number of invalid pages in B=M):
  (A3.1) Perform bit line-wise block erase on B;
(AM3) Else If (number of invalid pages in B≥O):
  (AM3.1) Read valid page(s) from B and buffer read valid page(s);
  (AM3.2) Perform bit line-wise block erase on B;
(A4) Else:
  (A4.1) Perform word line-wise sub-block erase of i invalid pages of B;
(A5) SET each erased word line of B, sequentially, in accordance with a buffered valid page or a data page included in the i buffered write requests;
(A6) return to (A1).

Algorithm 1M is a modified version of Algorithm 1, discussed above. Algorithm 1M may be considered to include a reset phase and a subsequent set phase. The reset phase may also be referred to as an erase phase. According to at least some example embodiments of the inventive concepts, steps (A3), (A3.1), (A3M), (AM3.1), (AM3.2), (A4) and (A4.1) are included in the reset phase of Algorithm 1M, and step (A5) is included in the set phase of Algorithm 1M.

According to at least some example embodiments of the inventive concepts, steps (A1)-(A3.1), (A.4) and (A6) in Algorithm 1M are identical to steps (A1)-(A3.1), (A.4) and (A6) in Algorithm 1. Algorithm 1M may differ from Algorithm 1 in that Algorithm 1M further includes steps (AM3), (AM3.1), and (AM3.2). Algorithm 1M may further differ from Algorithm 1 with respect to the manner in which steps (A4) and (A5) are performed, as is discussed in greater detail below. For the purpose of simplicity, explanations of steps in Algorithm 1M that are identical to steps in Algorithm 1 will not be repeated in the description of Algorithm 1M.

Referring to step (AM3), according to at least some example embodiments of the inventive concepts, in step (AM3), the memory controller 1000 determines whether or not a first condition is met (i.e., the condition from step (A3): the number of invalid pages in B=M). If the controller 1000 determines that the first condition is met, the memory controller proceeds to step (A4) without performing either of steps (AM3.1) and (AM3.2). If the controller 1000 determines that the first condition is not met, the memory controller 1000 determines whether or not a second condition is met. According to at least some example embodiments of the inventive concepts the second condition may be: the number of invalid pages in B≥O. For example, the memory controller 1000 may determine whether or not the number of invalid pages in the selected block B is greater than or equal to a threshold O, where O is a positive integer less than M. If the memory controller 1000 determines that the second condition is not met (i.e., if the memory controller 1000 determines that the number of invalid pages in the selected block B is not greater than or equal to the threshold O), the memory controller 1000 proceeds to step (A4) without performing either of steps (AM3.1) and (AM3.2). Alternatively, if the memory controller 1000 determines that the number of invalid pages in the selected block B is greater than or equal to the threshold O, the memory controller 1000 proceeds to steps (AM3.1) and (AM3.2).

In step (AM3.1), the memory controller 1000 may read each of the valid pages in the selected block B and buffer the valid pages. For example, the memory controller 1000 may buffer the valid pages read from the selected block B in the RAM 112. For example, the memory controller 1000 may determine which pages, in the selected block B, are valid by consulting the validity table 160. After step (AM3.1), the memory controller may proceed to step (AM3.2).

In step (AM3.2), the memory controller 1000 may perform a bit-line wise erase operation on the selected block B. According to at least some example embodiments of the inventive concepts, step (AM3.2) may be identical to step (A3.1) discussed above with respect to Algorithm 1. For example, in step (AM3.2), the memory controller may perform a bit line-wise block erase in the same manner discussed above with respect to step (A3.1) in Algorithm 1. After step (AM3.2), the memory controller 1000 proceeds to step (A4).

In step (A4), the memory controller may determine whether both of the first condition (i.e., the condition from step (A3): the number of invalid pages in B=M) and the second condition (i.e., the condition from step (AM3): the number of invalid pages in B≥O) are met. If at least one of the first and second conditions is met, then the memory controller 1000 proceeds to step (A5) without performing step (4.1). Otherwise, if the memory controller 1000 determines that neither of the first and second conditions is met (i.e., the memory controller 1000 determines that the first and second conditions are both not met), then the memory controller 1000 proceeds to step (A4.1). According to at least some example embodiments of the inventive concepts, step (4.1) in Algorithm 1M is identical to step (A4.1) described above with respect to Algorithm 1. After step (A4.1), the memory controller 1000 proceeds to step (A5).

In step (A5), each word line of the selected block B that was erased in step (A3.1) or step (A4.1) is SET, sequentially, in accordance with a data page included in the i buffered write requests or a valid data page that was buffered in step (AM3.1). For example, in step (A5), for each word line that was erased in step (A3.1) or step (A4.1), the memory controller 1000 may control the PRAM device 2000 to select the erased word line, apply the set voltage VSET to the selected erased word line, ground the bit lines connected to each memory cell of the selected erased word line that needs to be set to the LRS in accordance with (a) a data page corresponding to the selected erased word line from among the data pages of the i buffered write requests or (b) a valid data page buffered in step (AM3.1), apply the voltage VSWL to each of the unselected word lines, and apply the voltage VSBL to each of the unselected bit lines, thereby selectively setting the resistivity states of memory cells from among the memory cells of the selected erased word line to the LRS. After step (A5), the memory controller 1000 proceeds to step (A6).

Thus, in Algorithm 1M, so long as the number of invalid pages is equal to or above the threshold value O, a full block-erase operation may be performed on the selected block B, thereby erasing both valid and invalid pages, after the valid pages of the selected block B are buffered. A value of the threshold O may be set in accordance with the preferences of a designer, manufacturer and/or user of the phase-change memory device 1, for example, based on an empirical analysis of the threshold O. Example values of the threshold O include, but are not limited to, M−1, M−2, M−4, M−8, (¾)M, M/2, etc.

Algorithm 2, an example of the Sub-block-RESET-before-SET without prior read scheme, will now be discussed below.

Algorithm 2
Input: {i—threshold write request number}
(B1) Buffer i write requests;
(B2) Selected block B←block with most invalid pages;
(B3) Target sub-block S←invalid word lines in B;
(B4) For each word line in S:
   (B4.1) selectively RESET memory cells of word line in accordance with a data page included in the i write requests;
(B5) For each word line in S:
   (B5.1) selectively SET cells of word line in accordance with a data page included in the i buffered write requests;
(B6) return to (B1).

According to at least some example embodiments of the inventive concepts, Algorithm 2 is an algorithm for performing a write operation in a PRAM device. As is discussed in greater detail below, Algorithm 2 includes writing data to memory cells of a PRAM device by performing word line-wise RESET operations on each invalid word line in the selected block B in accordance with the write data being written before performing word line-wise SET operations on each invalid (or, partially written) word line in the selected block B in accordance with the write data being written. According to at least some example embodiments of the inventive concepts, Algorithm 2 includes steps (B1)-(B6), each of which may be performed executed and/or controlled by, for example, the memory controller 1000. According to at least some example embodiments of the inventive concepts, Algorithm 2 may be considered to include a reset phase and a set phase. The reset phase may also be referred to as an erase phase. According to at least some example embodiments of the inventive concepts, steps (B4) and (B4.1) are included in the reset phase of Algorithm 2, and steps (B5) and (B5.1) are included in the set phase of Algorithm 2. Further, as is discussed in greater detail below, in general, the memory controller 1000 may be configured such that the reset phase of Algorithm 2 includes controlling the memory device 2000 to selectively reset resistivity states of PRAM cells, from among the PRAM cells included in two or more first word lines of the selected block, to a high resistivity state in accordance with the write data included in a first number of buffered write requests, and the set phase includes controlling the memory device 2000 to selectively set resistivity states of PRAM cells, from among the PRAM cells included in the two or more first word lines, to a low resistivity state in accordance with the write data included in the first number of buffered write requests.

Referring to Algorithm 2, in step (B1), i write requests are buffered, and in step (B2), a block with the most invalid pages is selected as the selected block B. Steps (B1) and (B2) may be performed in a manner identical to that described above with respect to steps (A1) and (A2) of Algorithm 1, respectively. Thus, for the purpose of simplicity, further explanation of steps (B1) and (B2) is not provided in the present description of Algorithm 2. As is discussed above with reference to Algorithm 1, according to at least some example embodiments of the inventive concepts, i is a positive integer greater than 1 and less than the number of rows per block (e.g., M).

In step (B3), the invalid word lines of the selected block B are designated as the sub-block S. For example, referring to FIG. 1C, the memory controller 1000 may refer to the validity table 160 and designate, as the sub-block S, the pages of the selected block B that are identified by the validity table 160 as being invalid. Next, the memory controller 1000 may proceed to step (B4).

In step (B4), each word line in the sub-block S is selected, sequentially, and step (B4.1) is performed for each selected word line. In step (B4.1), the memory cells of the selected word line are selectively RESET in accordance with a data page included in the i write requests buffered in step (B1). For example, using the second block 2130 and the sub-block 2135 of FIG. 1A as the examples of the selected block B and a sub-block S, in step (B4), the memory controller 1000 may control the PRAM device 2000 to sequentially select each one of the i invalid word lines in the sub-block 2135, one at a time. Further, for each selected invalid word line, the memory controller 1000 may control the PRAM device 2000 to perform step (B4.1) by grounding the selected invalid word line (i.e., applying 0V to the selected word line) while applying the voltage VRWL to each of the other word lines in the second block 2130 (e.g., all of the unselected word lines in the second block 2130); and applying the reset voltage VRST to each bit line that is connected to a memory cell of the selected word line that should be in the HRS in accordance with the write data being written to the sub-block S (e.g., each memory cell of the selected invalid word line that should store the binary value "1" in accordance with the data page corresponding to the selected invalid word line, from among the data pages of the i write requests buffered in step (B1)), while applying the voltage VRBL to the bit lines connected to the remaining memory cells of the selected invalid word line, thereby selectively resetting the resistivity states of certain memory cells in the selected invalid word line to the HRS. After performing step (B4), the memory device may proceed to step (B5).

In step (B5), each word line in the sub-block S is selected, sequentially, and step (B5.1) is performed for each selected word line. In step (B5.1), the memory cells of the selected word line are selectively SET in accordance with a data page included in the i write requests buffered in step (B1). Though, steps (B5) and (B5.1) are discussed with reference to "invalid word lines," it will be understood that the invalid word lines of sub-block S were partially written to in step (B4). Thus, the "invalid word lines" discussed with reference to step (B5) may also be considered, and occasionally referred to as, partially written word lines. For example, using the second block 2130 and the sub-block 2135 of FIG. 1A as examples of the selected block B and a sub-block S, in step (B5), the memory controller 1000 may control the PRAM device 2000 to sequentially select each one of the i partially written word lines in the sub-block 2135, one at a time. Further, for each selected partially written word line, the memory controller 1000 may control the PRAM device 2000 to perform step (B5.1) by applying the set voltage VSET to the selected partially written word while applying the voltage VSWL to each of the other word lines in the second block 2130 (e.g., all of the unselected word lines in the second block 2130); and grounding (i.e., applying 0V to) each bit line that is connected to a memory cell of the selected partially written word line that should be in the LRS in accordance with the write data being written to the sub-block S (e.g., each memory cell of the selected partially written word line that should store the binary value "0" in accordance with the data page corresponding to the selected partially written word line, from among the data pages of the i write requests buffered in step (B1)), while applying the voltage VSBL to the bit lines connected to the remaining memory cells of the selected partially written word line, thereby selectively setting the resistivity states of certain memory cells in the selected partially written word line to the LRS. After performing step (B5), the memory device may proceed to step (B6).

In step (B6), the algorithm returns to step (B1) until i new write requests are buffered. For example, in step (B6), the memory controller 1000 may return to step (B1) and buffer new received write requests in the write buffer 150 until i new write requests have been buffered.

As is discussed above in section II of the present specification, the memory cell array 2100 of the PRAM device 2000 may include SLCs, MLCs, or a mixture of SLCs and MLCs. For the purpose of simplicity, Algorithms 1, 1M and 2 are discussed above with reference SLCs of the memory cell array 2100 of the PRAM device 2000 (e.g., memory cells 7 of FIG. 1D that each store a single bit of data). However, according to at least some example embodiments of the inventive concepts, Algorithms 1, 1M and 2 may also be executed with respect to multi-level cell (MLCs) of the memory cell array 2100 of the PRAM device 2000 (e.g., memory cells 7 of FIG. 1D that each store two or more bits of data), as is shown and discussed in greater detail below with reference to Algorithm 1(MLC), Algorithm 1M(MLC) and Algorithm 2(MLC).

Because Algorithms 1, 1M and 2 are discussed, with reference to WLs that include SLCs, in the discussions of Algorithms 1, 1M and 2, a WL storing a valid page (or data page) may also be referred to as a valid WL, and a WL storing an invalid page (or data page) may also be referred to as an invalid WL, as is discussed above. However, as is discussed in greater detail below, in the discussions of Algorithms 1(MLC), 1M(MLC) and 2(MLC), each WL includes MLCs, and thus, each WL can store more than only one data page. Consequently, a WL storing one or more valid pages (or data pages) may be referred to as a valid WL, and a WL storing only invalid pages (or data pages), and no valid pages (or data pages), may be referred to as an invalid WL.

For the purpose of simplicity, explanations of steps in Algorithm 1(MLC), Algorithm 1M(MLC) and Algorithm 2(MLC) that are identical to steps in Algorithm 1, Algorithm 1M, and Algorithm 2, respectively, will not be repeated in the descriptions of Algorithm 1(MLC), Algorithm 1M(MLC) and Algorithm 2(MLC) below.

Algorithm 1(MLC)
Input: {n×i—threshold write request number, M number of rows per block}
(A1) Buffer n×i write requests;
(A2) Selected block B←block with most invalid WLs;
(A3) If number of invalid WLs in B=M:
  (A3.1) Perform bit line-wise block erase on B;
(A4) Else:
  (A4.1) Perform word line-wise sub-block erase of i invalid WLs of B;
(A5) SET each erased WL of B, sequentially, in accordance with n data pages included in the n×i buffered write requests;
(A6) return to (A1).

Algorithm 1M(MLC)
Input: {n×i—threshold write request number, M number of rows per block}
(A1) Buffer n×i write requests;
(A2) Selected block B←block with most invalid WLs;
(A3) If (number of invalid WLs in B=M):
  (A3.1) Perform bit line-wise block erase on B;
(AM3) Else If (number of invalid WLs in B≥O):
  (AM3.1) Read pages from the valid WLs of B and buffer read pages;
  (AM3.2) Perform bit line-wise block erase on B;
(A4) Else:
  (A4.1) Perform word line-wise sub-block erase of i invalid WLs of B;
(A5) SET each erased word line of B, sequentially, in accordance with n pages, each of which is a buffered page of one of the valid WLs of B or a data page included in the n×i buffered write requests;
(A6) return to (A1).

Algorithm 2(MLC)
Input: {n×i—threshold write request number}
(B1) Buffer n×i write requests;
(B2) Selected block B←block with most invalid WLs;
(B3) Target sub-block S←invalid WLs in B;
(B4) For each WL in S:
  (B4.1) selectively RESET memory cells of WL in accordance with a group of n data pages included in the n×i buffered write requests;
(B5) For each WL in S:
  (B5.1) selectively SET cells of WL in accordance with a group of n data pages included in the n×i buffered write requests;
(B6) return to (B1).

Algorithms 1(MLC), 1M(MLC) and 2(MLC) differ from Algorithms 1, 1M and 2, respectively, in that that threshold write request number is n×i instead of i. Accordingly, in steps (A1) and (B1), n×i write requests are buffered instead of i write requests. The value n is the number of bits stored per memory cell in the memory cell array 2100 (or the portion thereof upon which Algorithm 1(MLC) is being performed). For example, if each memory cell stores two bits (e.g., "00," "01," "11," or "10"), then n=2. According to at least some example embodiments of the inventive concepts, n is a positive integer greater than 1. Further, as is discussed above with reference to Algorithm 1, according to at least some example embodiments of the inventive concepts, i is a positive integer greater than 1 and less than the number of rows per block (e.g., M).

Algorithms 1(MLC), 1M(MLC) and 2(MLC) further differ from Algorithms 1, 1M and 2, respectively, in that that, in steps (A2) and (B2), the selected block B is set to the block with the most invalid WLs instead of the block with most invalid pages. For example, as is noted above, when the memory cells of a WL are MLCs instead of SLCs, the WL can include a plurality of data pages (e.g., n data pages) instead of only one data page. Further, as is also noted above, according to at least some example embodiments of the inventive concepts, in Algorithms 1(MLC), 1M(MLC) and 2(MLC), a WL is considered to be an invalid WL when all data pages of the n data pages included in the WL are invalid, and the WL is considered to be a valid WL when at least one data page of the n data pages included in the WL is valid.

Similarly, Algorithms 1(MLC), 1M(MLC) and 2(MLC) further differ from Algorithms 1, 1M and 2, respectively, in that that, steps (A3), (AM3), (A4.1) and (B3) are performed with respect to invalid WLs instead of invalid pages. Similarly, Algorithm 1M(MLC) differs from Algorithm 1M in that step (AM3.1) is performed with respect to the pages (e.g., n data pages) of each valid WL of block B instead of only the valid pages of block B. For example, as is discussed above, a WL that includes an invalid data page may, nonetheless, be a valid WL if the WL includes at least one valid data page. Thus, according to at least some example embodiments of the inventive concepts, step (AM3.1) of Algorithm 1M(MLC) may include reading both valid and invalid data pages of at least one valid WL.

Further, with respect to step (A5), Algorithms 1(MLC) and 1M(MLC) differ from Algorithms 1 and 1M in that step (A5) includes setting each erased WL of block B, sequentially, in accordance with n data pages included in the n×i buffered write requests. For example, if n=2, then in step (A5), each erased WL of block B may be set in accordance with a group of 2 data pages from among the 2×i buffered write requests, since each WL can store 2 data pages at once.

Additionally, Algorithm 2(MLC) further differs from Algorithm 2 in that step (B4.1) includes performing a selective RESET with respect to memory cells of each WL in accordance with a group of n data pages included in the n×i buffered write requests, instead of one data page included in i buffered write data requests, since each WL can store n data pages instead of one. Similarly, step (B5.1) includes performing a selective SET with respect to memory cells of each WL in accordance with a group of n data pages included in the n×i buffered write requests, instead of one data page included in i buffered write data requests.

Example applications of the memory system 900, memory controller 1000, and PRAM device 2000 will now be discussed below with reference to FIGS. 3-6.

Figure 3:
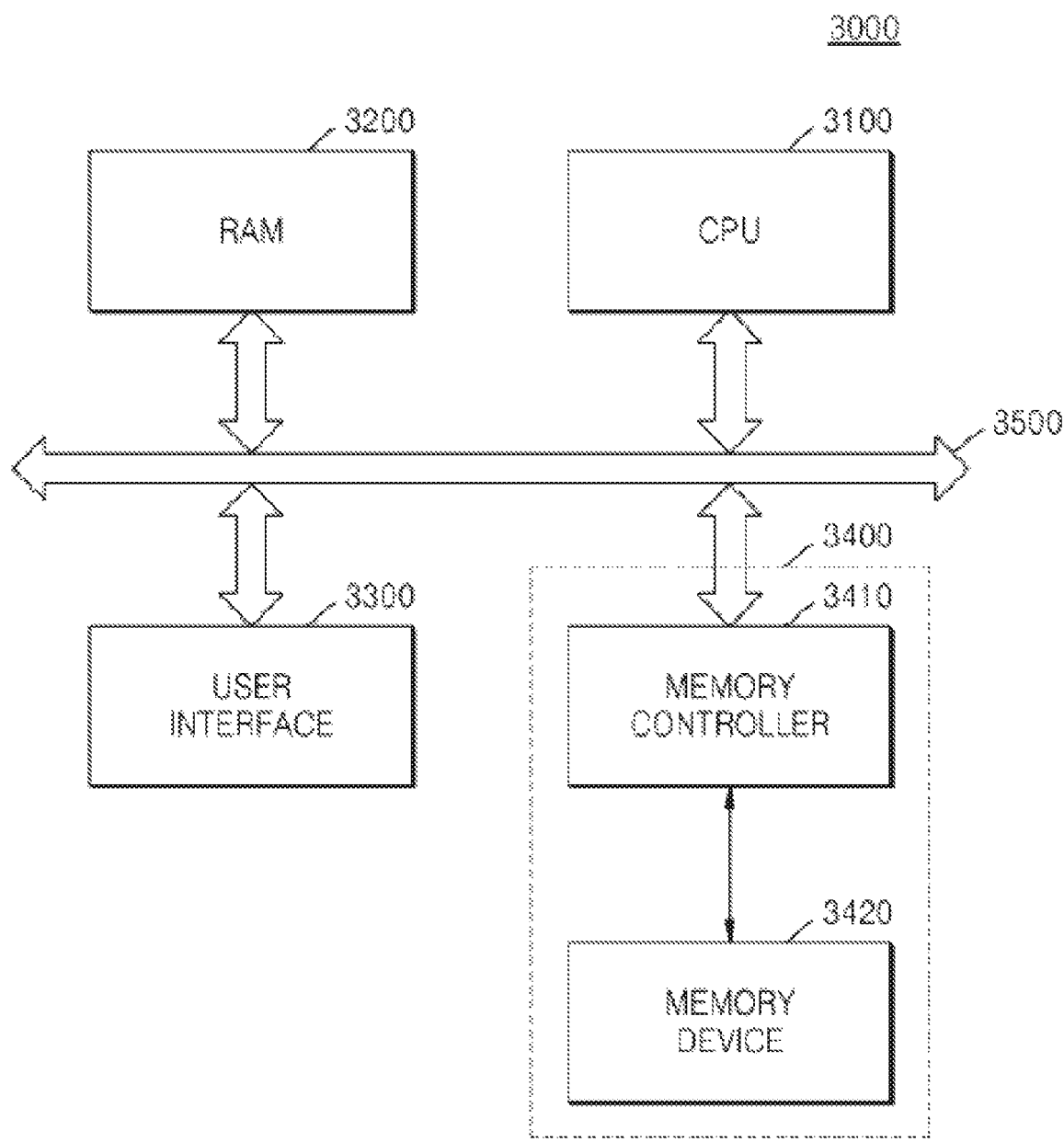
FIG. 3 is a block diagram showing a computer system including a memory system according to example embodiments of inventive concepts.

FIG. 3 is a block diagram showing a computer system 3000 including a memory system according to at least one example embodiment of the inventive concepts. The computer system 3000, such as a mobile device, a desktop computer, and a server, may employ a memory system 3400 according to at least one example embodiment of the inventive concepts.

The computer system 3000 may include a central processing unit 3100, a RAM 3200, a user interface 3300, and the memory system 3400, are electrically connected to buses 3500. The host as described above may include the central processing unit 3100, the RAM 3200, and the user interface 3300 in the computer system 3000. The central processing unit 3100 may control the entire computer system 3000 and may perform calculations corresponding to user commands input via the user interface 3300. The RAM 3200 may function as a data memory for the central processing unit 3100, and the central processing unit 3100 may write/read data to/from the memory system 3400.

As in example embodiments of inventive concepts described above, the memory system 3400 may include a memory controller 3410 and a memory device 3420.

According to at least one example embodiment of the inventive concepts, the memory controller 3410 may be implemented by the memory controller 1000 discussed above with reference to FIGS. 1A-2C and the memory device 3420 may be implemented by the PRAM device 2000 discussed above with reference to FIGS. 1A-2C.

Figure 4:
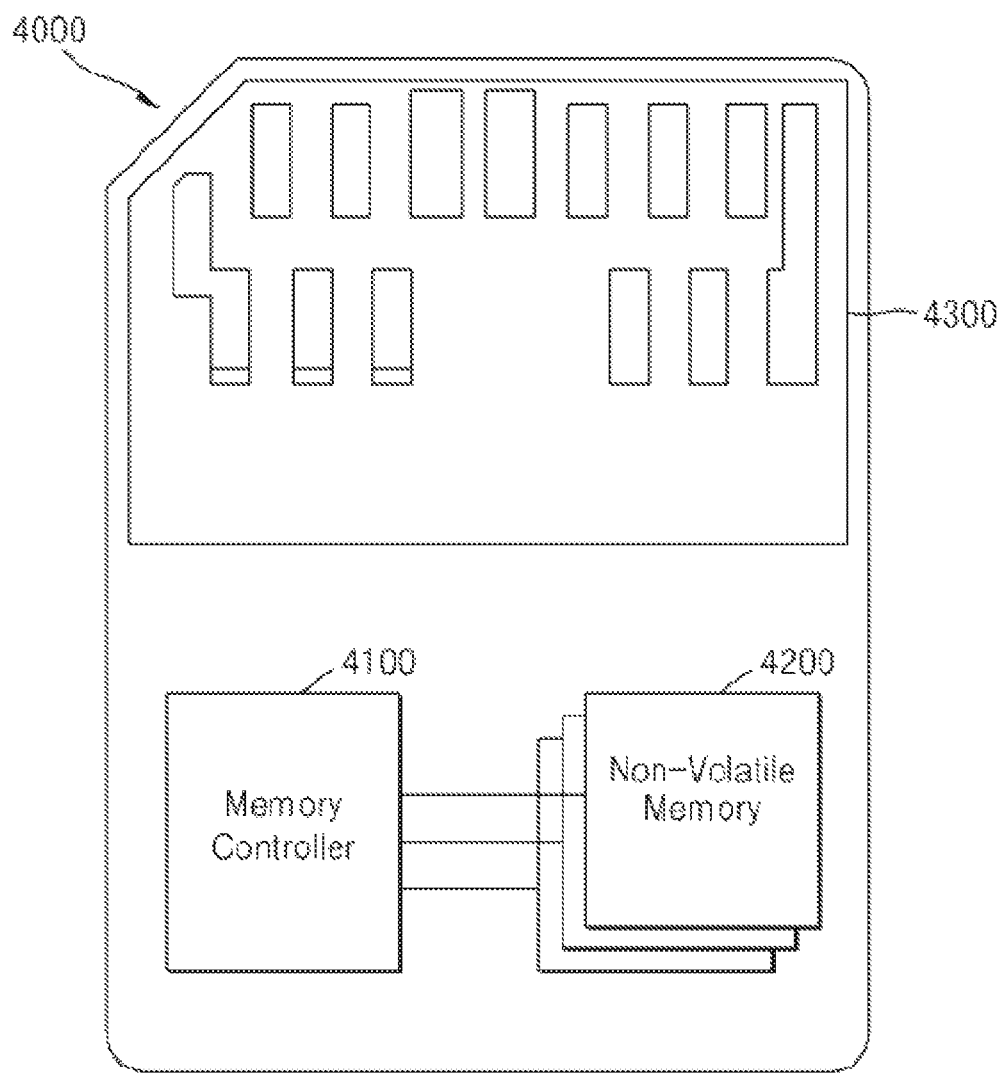
FIG. 4 is a block diagram showing a memory card according to at least one example embodiment of the inventive concepts.

FIG. 4 is a block diagram showing a memory card 4000 according to at least one example embodiment of the inventive concepts. A memory system 900 according to at least some example embodiments of inventive concepts discussed above with reference to FIGS. 1-2C may be the memory card 4000. For example, the memory card 4000 may include an embedded multimedia card (eMMC) or a secure digital (SD) card. As shown in FIG. 4, the memory card 4000 may include a memory controller 4100, a non-volatile memory 4200, and a port region 4300. According to at least one example embodiment of the inventive concepts, the memory controller 4100 may be implemented by the controller 1000 discussed above with reference to FIGS. 1-2C, and the non-volatile memory 4200 shown in FIG. 4 may be implemented by the PRAM device 2000 discussed above with reference to FIGS. 1-2C.

The memory controller 4100 may communicate with an external host via the port region 4300 in compliance with a pre-set protocol. The protocol may be eMMC protocol, SD protocol, SATA protocol, SAS protocol, or USB protocol.

Figure 5:
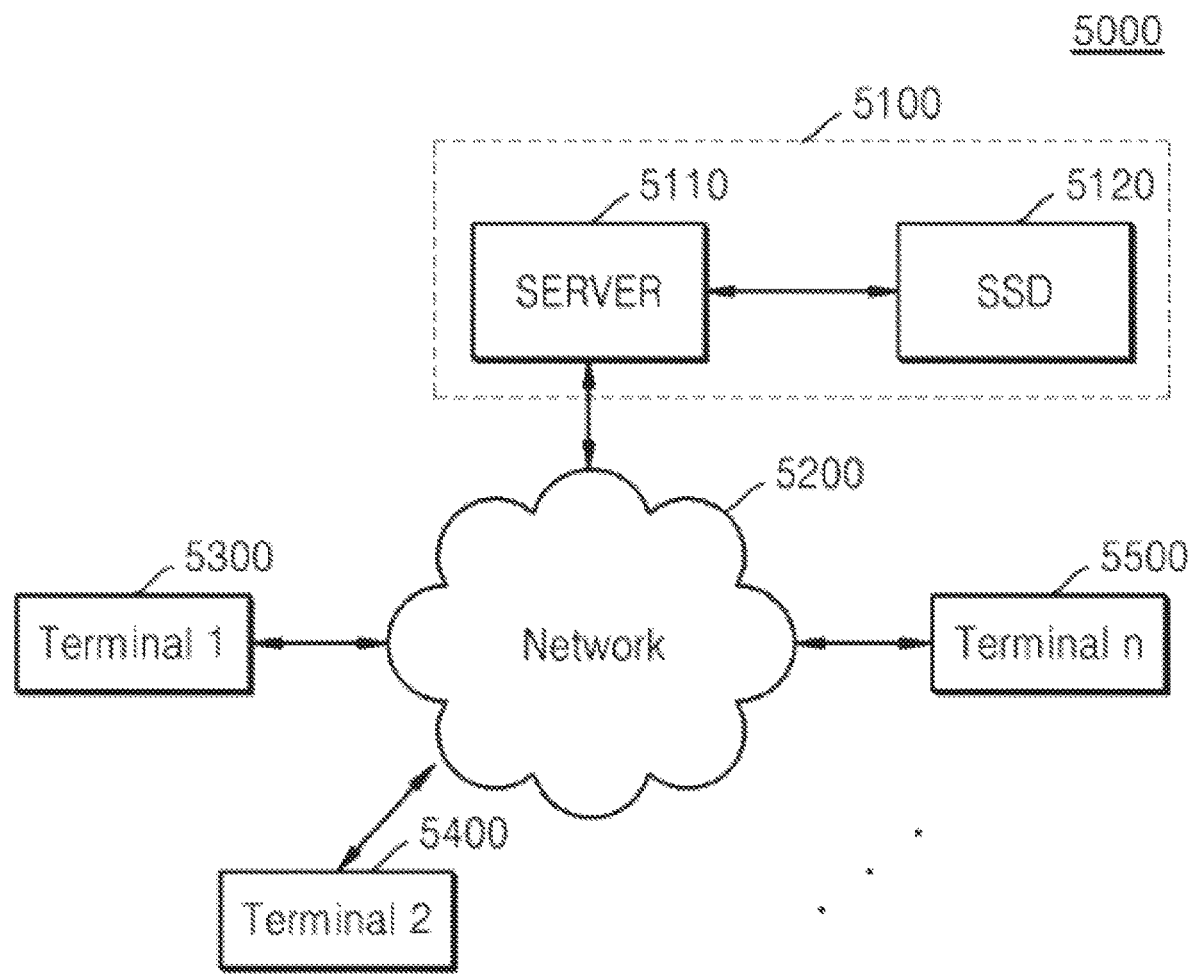
FIG. 5 is a block diagram showing an example network system including a memory system according to at least one example embodiment of the inventive concepts.

FIG. 5 is a block diagram showing an example network system 5000 including a memory system according to at least one example embodiment of the inventive concepts. As shown in FIG. 5, the network system 5000 may include a server system 5100 and a plurality of terminals 5300, 5400, and 5500 that are connected via a network 5200. The server system 5100 may include a server 5110 for processing requests received from the plurality of terminals 5300, 5400, and 5500 connected to the network 5200 and a SSD 5120 for storing data corresponding to the requests received from the terminals 5300, 5400, and 5500. Here, the SSD 5120 may be a memory system according to at least one example embodiment of the inventive concepts.

According to at least one example embodiment of the inventive concepts, SSD 5120 may be implemented by the memory system 900 discussed above with reference to FIGS. 1-2C.

Meanwhile, a memory system according to example embodiments of inventive concepts may be mounted via any of various packages. For example, a memory system according to at least one example embodiment of the inventive concepts may be mounted via any of packages including package on package (PoP), ball grid arrays (BGAs), chip scale packages (CSPs), plastic leaded chip Carrier (PLCC), plastic dual in-line package (PDIP), die in waffle pack, die in wafer form, chip on board (COB), ceramic dual in-line package (CERDIP), plastic metricquad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed:
1. A memory system comprising:
a memory controller; and
a memory device including a memory cell array,
the memory cell array including a plurality of bit lines and a plurality of blocks, each block including a plurality of word lines, each word line including a plurality of phase-change random access memory (PRAM) cells connected, respectively, to the plurality of bit lines, the memory controller being configured to buffer a first number of write requests each of which includes write data and configured to perform a write operation that includes a reset phase and a subsequent set phase, the memory controller being further configured such that,
the reset phase of the write operation includes erasing the PRAM cells included in first word lines from among the plurality of word lines included in a selected block, from among the plurality of blocks, and the set phase of the write operation includes, after the reset phase, writing the write data from the buffered first number of write requests to the PRAM cells of the first word lines.

2. The memory system of claim 1, wherein,
the memory system further comprises:
a write buffer, and
the memory controller is configured to buffer the first number of write requests in the write buffer.

3. The memory system of claim 2, wherein the memory controller is further configured to perform the write operation in response to determining that the first number of write requests buffered in the write buffer is equal to a reference number.

4. The memory system of claim 1, wherein,
the memory system further comprises:
a validity table, and
the memory controller is configured to store, in the validity table, meta data indicating, for each word line in each block, whether the word line is valid or invalid.

5. The memory system of claim 4, wherein the memory controller is further configured to select the first word lines such that the first word lines are word lines of the selected block that are identified as invalid word lines in the validity table.

6. The memory system of claim 4, wherein the memory controller is further configured to select, as the selected block, the block, from among the plurality of blocks, having a highest number of word lines identified as invalid word lines in the validity table.

7. The memory system of claim 4, wherein the memory controller is further configured to perform the erase operation by,
determining whether or not a total number of the word lines in the selected block that are identified as invalid word lines by the validity table exceeds a threshold value,
performing a bit line-wise block erase process on the selected block, in response to determining that the total number of the word lines in the selected block that are identified as invalid word lines by the validity table exceeds a threshold value, and
performing a word line-wise erase process on only the word lines in the selected block that are identified by the validity table as being invalid, in response to determining that the total number of the word lines in the selected block that are identified as invalid word lines by the validity table does not exceed the threshold value.

8. The memory system of claim 1, wherein the PRAM cells included in first word lines are single level cells (SLCs).

9. The memory system of claim 1, wherein the PRAM cells included in first word lines are multi-level cells (MLCs).

10. A memory system comprising:
a memory controller; and
a memory device including a memory cell array,
the memory cell array including a plurality of bit lines and a plurality of blocks, each block including a plurality of word lines, each word line including a plurality of phase-change random access memory (PRAM) cells connected, respectively, to the plurality of bit lines,
the memory controller being configured to buffer a first number of write requests each of which includes write data and configured to perform a write operation that includes a reset phase and a subsequent set phase,
the memory controller being further configured such that,
the reset phase includes controlling the memory device to selectively reset resistivity states of PRAM cells, from among the PRAM cells included in two or more first word lines of a selected block, to a high resistivity state in accordance with the write data included in the first number of write requests, and
the set phase includes controlling the memory device to selectively set resistivity states of PRAM cells, from among the PRAM cells included in the two or more first word lines, to a low resistivity state in accordance with the write data included in the first number of write requests.

11. The memory system of claim 10, wherein,
the memory system further comprises:
a write buffer, and
the memory controller is configured to buffer the first number of write requests in the write buffer.

12. The memory system of claim 11, wherein the memory controller is further configured to perform the write operation in response to determining that the first number of write requests buffered in the write buffer is equal to a reference number.

13. The memory system of claim 10, wherein,
the memory system further comprises:
a validity table, and
the memory controller is configured to store, in the validity table, meta data indicating, for each word line in each block, whether the word line is valid or invalid.

14. The memory system of claim 13, wherein the memory controller is further configured to select the two or more first word lines such that the two or more first word lines are word lines of the selected block that are identified as invalid word lines in the validity table.

15. The memory system of claim 13, wherein the memory controller is further configured to select, as the selected block, the block, from among the plurality of blocks, having a highest number of word lines identified as invalid word lines in the validity table.

16. The memory system of claim 10, wherein the memory controller is configured to perform the reset phase by, sequentially selecting each invalid word line in the two or more first word lines, and, for each selected word line,
controlling the memory device to ground the selected word line,
controlling the memory device to apply an intermediate voltage to unselected word lines of the selected block,
controlling the memory device to apply a reset voltage to each bit line that is connected to a PRAM cell of the selected word line that should be in a high resistance state in accordance with write data corresponding to the selected word line from among the write data of the buffered first number of write requests, and controlling the memory device to apply an intermediate voltage to bit lines connected to the remaining PRAM cells of the selected word line.

17. The memory system of claim 10, wherein the memory controller is configured to perform the set phase by, sequentially selecting each invalid word line in the two or more first word lines, and, for each selected word line, controlling the memory device to apply a set voltage the selected word line, controlling the memory device to apply an intermediate voltage to unselected word lines of the selected block, controlling the memory device to ground each bit line that is connected to a PRAM cell of the selected word line that should be in a low resistance state in accordance with write data corresponding to the selected word line from among the write data of the buffered first number of write requests, and controlling the memory device to apply an intermediate voltage to bit lines connected to the remaining PRAM cells of the selected word line.

18. The memory system of claim 10, wherein the PRAM cells included in first word lines are single level cells (SLCs).

19. The memory system of claim 10, wherein the PRAM cells included in first word lines are multi-level cells (MLCs).

* * * * *